United States Patent
Tsai et al.

(10) Patent No.: US 10,361,293 B1
(45) Date of Patent: Jul. 23, 2019

(54) VERTICAL FIN-TYPE DEVICES AND METHODS

(71) Applicant: GLOBALFOUNDRIES INC., Grand Cayman (KY)

(72) Inventors: Tsung-Che Tsai, Essex Junction, VT (US); Alain F. Loiseau, Williston, VT (US); Robert J. Gauthier, Jr., Williston, VT (US); Souvick Mitra, Essex Junction, VT (US); You Li, South Burlington, VT (US); Mickey H. Yu, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/878,478

(22) Filed: Jan. 24, 2018

(51) Int. Cl.
| | | |
|---|---|---|
| *H01L 29/74* | (2006.01) |
| *H01L 29/868* | (2006.01) |
| *H01L 23/535* | (2006.01) |
| *H01L 21/761* | (2006.01) |
| *H01L 29/66* | (2006.01) |
| *H01L 21/768* | (2006.01) |

(Continued)

(52) U.S. Cl.
CPC ........ *H01L 29/7416* (2013.01); *H01L 21/761* (2013.01); *H01L 21/76895* (2013.01); *H01L 23/535* (2013.01); *H01L 29/0646* (2013.01); *H01L 29/66371* (2013.01); *H01L 29/868* (2013.01); *H01L 27/0262* (2013.01)

(58) Field of Classification Search
CPC .................................................. H01L 27/0262
See application file for complete search history.

(56) References Cited

U.S. PATENT DOCUMENTS

| 8,809,905 B2 | 8/2014 | Lin et al. |
| 9,240,355 B2 | 1/2016 | Cheng et al. |
| 9,318,622 B1 | 4/2016 | Logan et al. |

(Continued)

OTHER PUBLICATIONS

Lin et al., "Area-Efficient and Low-Leakage Diode String for On-Chip ESD Protection," IEEE Transactions on Electron Devices, vol. 63, No. 2, Feb. 2016, pp. 531-536.

(Continued)

*Primary Examiner* — Benjamin P Sandvik
(74) *Attorney, Agent, or Firm* — Gibb & Riley, LLC; Anthony J. Canale

(57) ABSTRACT

Disclosed is an integrated circuit (IC) structure that incorporates a string of vertical devices. Embodiments of the IC structure include a string of two or more vertical diodes. Other embodiments include a vertical diode/silicon-controlled rectifier (SCR) string and, more particularly, a diode-triggered silicon-controlled rectifier (VDTSCR). In any case, each embodiment of the IC structure includes an N-well in a substrate and, within that N-well, a P-doped region and an N-doped region that abuts the P-doped region. The P-doped region can be anode of a vertical diode and can be electrically connected to the N-doped region (e.g., by a local interconnect or by contacts and metal wiring) such that the vertical diode is electrically connected to another vertical device (e.g., another vertical diode or a SCR with vertically-oriented features). Also disclosed is a manufacturing method that can be integrated with methods of manufacturing vertical field effect transistors (VFETs).

16 Claims, 22 Drawing Sheets

(51) Int. Cl.
    *H01L 29/06*     (2006.01)
    *H01L 27/02*     (2006.01)

(56) References Cited

U.S. PATENT DOCUMENTS

| | | |
|---|---|---|
| 9,385,195 B1* | 7/2016 | Zhang ................. H01L 29/1033 |
| 9,391,065 B1* | 7/2016 | Gauthier, Jr. ....... H01L 29/0649 |
| 9,397,163 B2 | 7/2016 | Campi, Jr. et al. |
| 9,704,852 B2 | 7/2017 | Gauthier, Jr. et al. |
| 9,748,219 B1* | 8/2017 | Ker .................... H01L 27/0262 |
| 9,780,088 B1 | 10/2017 | Balakrishnan et al. |
| 2013/0285111 A1 | 10/2013 | Di Sarro et al. |
| 2015/0054027 A1 | 2/2015 | Clark, Jr. et al. |
| 2015/0060939 A1* | 3/2015 | Di Sarro ............ G06F 17/5072 257/140 |
| 2015/0187753 A1* | 7/2015 | Campi, Jr. .......... H01L 27/0262 257/357 |
| 2016/0056147 A1* | 2/2016 | Li ...................... H01L 27/0262 257/173 |
| 2017/0287902 A1 | 10/2017 | Balakrishnan et al. |
| 2018/0190644 A1* | 7/2018 | Li ...................... H01L 27/0262 |

OTHER PUBLICATIONS

Masahara et al., "Vertical Double-Gate MOSFET Device Technology," IEEJ Transactions on Electronics, Information and Systems, vol. 126, No. 6, 2006, pp. 702-707.

* cited by examiner

VERTICAL FIN-TYPE DEVICES AND METHODS

BACKGROUND

Field of the Invention

The present invention relates to integrated circuit (IC) structures and, more particularly, to IC structures that incorporate strings of vertical devices and methods of forming the IC structures.

Description of Related Art

Integrated circuit (IC) design decisions are often driven by device scalability, device density, manufacturing efficiency and costs. For example, to increase device density, fin-type field effect transistors (FINFETs) were developed. A fin-type FET (FINFET) is a non-planar FET that incorporates a semiconductor fin (i.e., a relatively tall, thin, rectangular-shaped, semiconductor body) and, within the semiconductor fin, a channel region positioned laterally between source/drain regions. A gate is positioned adjacent to the top surface and opposing sidewalls of the semiconductor fin at the channel region. Thus, the FINFET exhibits multi-dimensional field effects as compared to the single-dimensional field effects exhibited by a conventional planar FET and, thereby allows for improved gate control over the channel region.

Recently, vertical FETs (VFETs) (also referred to in the art as gate-all-around FETs (GAAFETs)) were developed to further increase device density over that achievable with FINFETs. A VFET, like a FINFET, incorporates a semiconductor fin (i.e., a relatively tall, thin, rectangular-shaped, semiconductor body). However, in a VFET, the FET components are stacked vertically on a substrate as opposed to being positioned side by side across a substrate. Specifically, a VFET typically includes a lower source/drain region in a substrate, a semiconductor fin that extends upward from the lower source/drain region, and an upper source/drain region that is epitaxially grown on the top surface of the semiconductor fin. A gate (e.g., a replacement metal gate (RMG)) laterally surrounds the semiconductor fin, which functions as the channel region and the gate is electrically isolated from the lower source/drain region and the upper source/drain region by a lower dielectric spacer and an upper dielectric spacer, respectively. Unfortunately, manufacturing VFETs along with other non-vertical devices (e.g., diodes, silicon-controlled rectifiers (SCRs), etc.) can negatively impact manufacturing efficiency and increase manufacturing costs.

SUMMARY

In view of the foregoing, disclosed herein are embodiments of an integrated circuit (IC) structure that incorporates a string of vertical devices. Some embodiments of the IC structure include a string of at least two vertical diodes. Other embodiments of the IC structure include a vertical diode/silicon-controlled rectifier (SCR) string and, more particularly, a diode-triggered silicon-controlled rectifier (VDTSCR). In any case, each embodiment of the IC structure can include an N-well in a semiconductor substrate and, within that N-well, a P-doped region and an N-doped region that abuts the P-doped region. The P-doped region can be an anode of a vertical diode and can be electrically connected to the N-doped region (e.g., by a local interconnect or by contacts and metal wiring) such that the anode of the vertical diode in the string is electrically connected to another vertical device (e.g., to a cathode of another vertical diode or to a SCR with vertically-oriented features). Also disclosed herein are embodiments of a method of manufacturing the IC structure embodiments and this method can be integrated with methods of manufacturing vertical field effect transistors (VFETs) in order to improve manufacturing efficiency, increase device density and decrease manufacturing costs.

More particularly, disclosed are multiple embodiments of an integrated circuit (IC) structure. The IC structure can include a semiconductor substrate and an N-well in the semiconductor substrate. The IC structure can further include at least a pair of devices connected in a string including at least a first device and a second device. The first device can be a vertical diode. Specifically, the first device can include a first anode and, particularly, a P-doped region in the N-well of the semiconductor substrate. The first device can further include a first semiconductor fin having a lower end immediately adjacent to the first anode and an upper end opposite the lower end. The first device can further include a first cathode and, particularly, N-doped epitaxial semiconductor material immediately adjacent to the upper end of the first semiconductor fin. The second device can be another vertical device (e.g., a vertical diode, a silicon-controlled rectifier (SCR) with vertically-oriented features or any other suitable vertical device). In any case, the second device can include an N-doped region in the N-well of the semiconductor substrate and positioned laterally immediately adjacent to the first anode of the first device (i.e., abutting the P-doped region in the N-well). Furthermore, the first anode of the first device and this N-doped region can be electrically connected (e.g., by a local interconnect or by contacts and wiring) such that the first device is electrically connected to the second device.

As mentioned above, in some embodiments of the IC structure the second device in the pair of devices can be another vertical diode. In these embodiments, the N-doped region of the second device (which is in the N-well and abuts the first anode of the first device) can be a second cathode. The second device can further include a second semiconductor fin having a lower end immediately adjacent to the second cathode and an upper end opposite the lower end. The second device can further include a second anode and, particularly, P-doped epitaxial semiconductor material immediately adjacent to the upper end of the second semiconductor fin. A local interconnect or a combination of contacts and wiring can electrically connect the first anode of the first device to the second cathode of the second device.

As mentioned above, in other embodiments of the IC structure the second device can be a silicon-controlled rectifier (SCR) with vertically oriented features. In these embodiments, the IC structure can further include a P-well in the semiconductor substrate and positioned laterally immediately adjacent to the N-well. A shallow trench isolation (STI) region can be in the semiconductor substrate at the interface between the two well regions. The second device can include the N-doped region, which is in the N-well and which abuts the first anode of the first device, and can further include a second semiconductor fin having a lower end immediately adjacent to the N-well and an upper end opposite the lower end. This second semiconductor fin can be positioned on the N-well between and physically separated from both the N-doped region and the STI region. The second device can further include a second anode and, particularly, P-doped epitaxial semiconductor material immediately adjacent to the upper end of the second semiconductor fin. The second device can further include an additional semiconductor fin having a lower end immediately adjacent to the P-well and an upper end opposite the lower end. The second device can further include a second cathode and, particularly, N-doped epitaxial semiconductor material immediately adjacent to the upper end of the additional semiconductor fin. A local interconnect or a combination of contacts and wiring can electrically connect the first anode of the first device and the N-doped region of the second device. With this configuration, the second device (i.e., the SCR) can be triggered, during operation, by the first device such that the resulting string is a diode-triggered silicon-controlled rectifier (VDTSCR).

Also disclosed herein are embodiments of a method of forming the above-described IC structure embodiments. In the method, a semiconductor substrate can be provided and at least an N-well can be formed in the semiconductor substrate. The method can further include forming a pair of devices on the semiconductor substrate. This pair of devices can be formed so as to include, for example, a first device and a second device connected in a string. The first device can be a vertical diode. Specifically, the first device can include a first anode and, particularly, a P-doped region in the N-well of the semiconductor substrate. The first device can further include a first semiconductor fin having a lower end immediately adjacent to the first anode and an upper end opposite the lower end. The first device can further include a first cathode and, particularly, N-doped epitaxial semiconductor material immediately adjacent to the upper end of the first semiconductor fin. The second device can be another vertical device (e.g., another vertical diode, a silicon-controlled rectifier (SCR) with vertically oriented features, or any other suitable vertical device). In any case, the second device can include an N-doped region in the N-well of the semiconductor substrate and positioned laterally immediately adjacent to the first anode of the first device (i.e., abutting the P-doped region in the N-well). The method can further include electrically connecting the first anode of the first device to the N-doped region of the second device (e.g., by forming a local interconnect or by forming a combination of contacts and wiring).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, manufacturing vertical field effect transistors (VFETs) along with other non-vertical devices (e.g., diodes, silicon-controlled rectifiers (SCRs), etc.) can negatively impact manufacturing efficiency and increase manufacturing costs.

In view of the foregoing, disclosed herein are vertical versions of various different types of devices and manufacturing techniques that can be integrated across to improve manufacturing efficiency, increase device density and decrease manufacturing costs. Specifically, disclosed herein are embodiments of an integrated circuit (IC) structure that incorporates at least one string of vertical devices. Some embodiments of the IC structure include a string of at least two vertical diodes. Other embodiments of the IC structure include a vertical diode/silicon-controlled rectifier (SCR) string and, more particularly, a diode-triggered silicon-controlled rectifier (VDTSCR). In any case, each embodiment of the IC structure can include an N-well in a semiconductor substrate and, within that N-well, a P-doped region and an N-doped region that abuts the P-doped region. The P-doped region can be an anode of a vertical diode and can be electrically connected to the N-doped region (e.g., by a local interconnect or by contacts and metal wiring) such that the anode of the vertical diode in the string is electrically connected to another vertical device (e.g., to a cathode of another vertical diode or to a SCR with vertically oriented features). Also disclosed herein are embodiments of a method of manufacturing the IC structure embodiments and this method can be integrated with methods of manufacturing vertical field effect transistors (VFETs) in order to improve manufacturing efficiency, increase device density and decrease manufacturing costs.

Figure 1A:
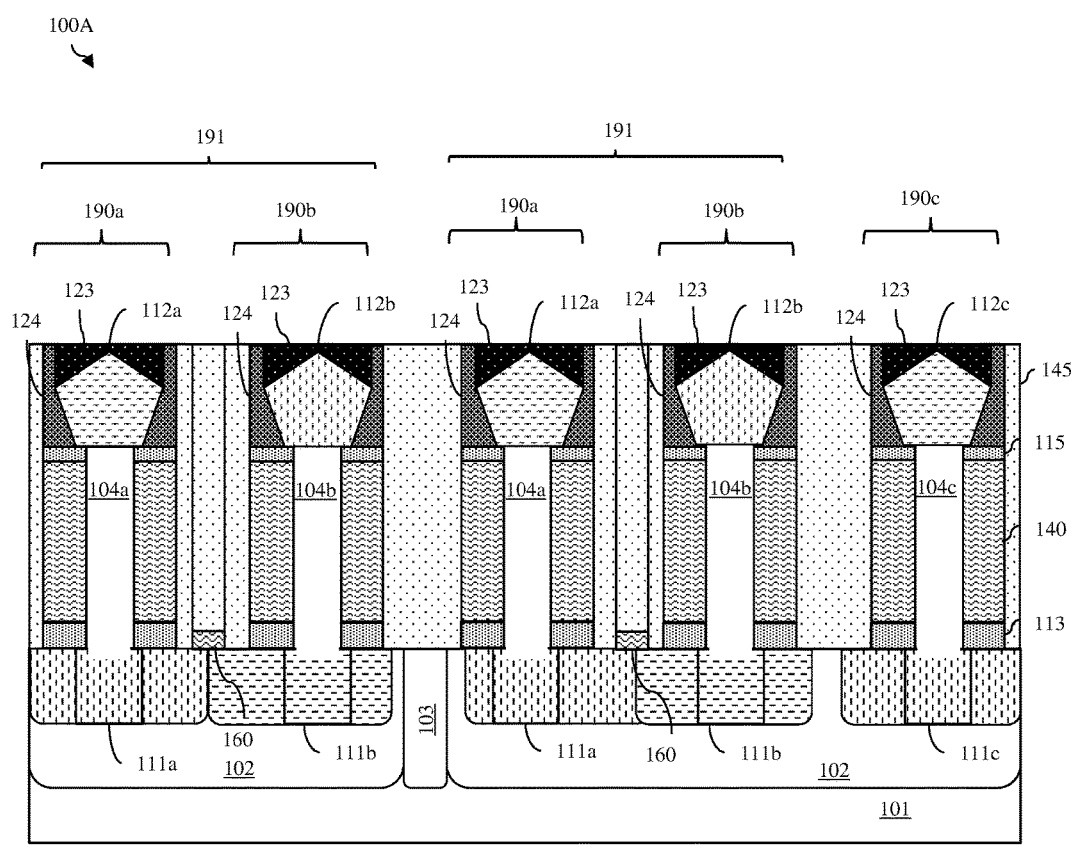
FIGS. 1A-1F and 2A-2B are cross-section drawings of different embodiments 100A-100F and 200A-200B of an integrated circuit (IC) structure.
Figure 1B:
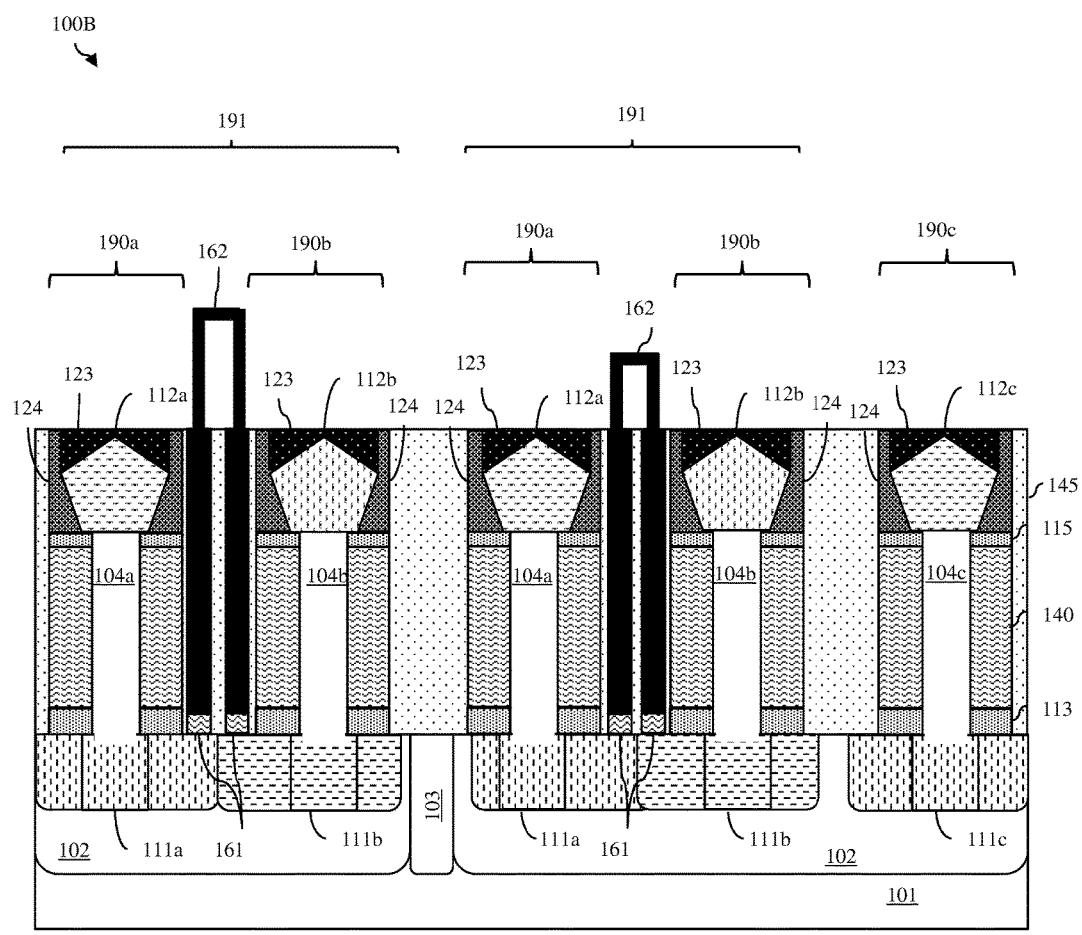
Figure 1C:
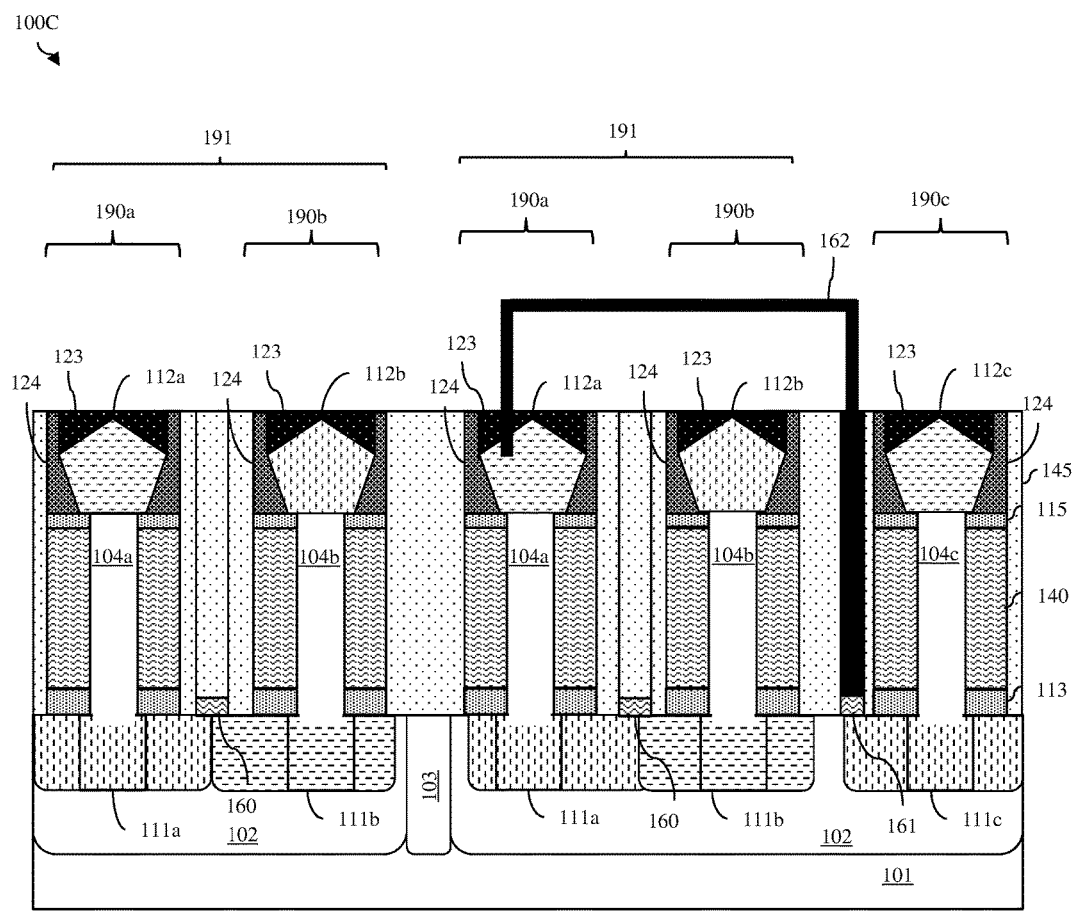

More particularly, FIGS. 1A-1F are cross-section drawings of different embodiments 100A-100F, respectively, of an integrated circuit (IC) structure that incorporates a string of at least two vertical diodes. A string of devices refers to a group (i.e., set, chain, cluster, etc.) of two or more electrically connected devices. For example, in a string of two diodes an anode of a first diode is electrically connected to a cathode of a second diode; in a string of three diodes, an anode of a first diode is electrically connected to a cathode of a second diode and an anode of the second diode is electrically connected to a cathode of a third diode; and so on. FIGS. 2A-2B are cross-section drawings of additional embodiments 200A-200B, respectively, of an IC structure that includes at least a vertical diode/silicon-controlled rectifier string.

The IC structure can include a semiconductor substrate 101, 201. The semiconductor substrate 101, 201 can be a bulk semiconductor substrate (e.g., a bulk silicon substrate), as illustrated. Alternatively, the semiconductor substrate 101, 201 can be a semiconductor layer above an insulator layer of a semiconductor-on-insulator wafer. Optionally, the semiconductor substrate 101, 201 can be doped so as to have P-type conductivity at a relatively low conductivity level (i.e., a P– substrate). The IC structure can further include at least one an N-well 102, 202 in the semiconductor substrate 101, 201. The IC structure can further include at least one pair 191, 291 of devices and, particularly, a first device 190a, 290a and a second device 190b, 290b connected in a string.

The first device 190a, 290a in each pair 191, 291 of devices can be a vertical diode. Specifically, the first device 190a, 290a can include a first anode 111a, 211a and, particularly, a P-doped region in an N-well 102, 202. The first device 190a, 290a can further include a first semiconductor fin 104a, 204a having a lower end immediately adjacent to the first anode 111a, 211a and an upper end opposite the lower end. The first device 190a, 290a can further include a first cathode 112a, 212a and, particularly, N-doped epitaxial semiconductor material (e.g., N+ epitaxial silicon) immediately adjacent to the upper end of the first semiconductor fin 104a, 204a.

The second device 190b, 290b in each pair 191, 291 can be another vertical device or a device with vertically oriented features. Specifically, the second device 190b, 290b can be another vertical diode (see the embodiments 100A-100F of FIGS. 1A-1F), a silicon-controlled rectifier (SCR) with vertically oriented features (see the embodiments 200A-200B of FIGS. 2A-2B), or any other suitable vertical device. In any case, the second device 190b, 290b can include an N-doped region 111b, 211b in the same N-well 102 as and positioned laterally immediately adjacent to (i.e., abutting) the first anode 111a, 211a of the first device 190a, 290a. Furthermore, the first anode 111a, 211a of the first device 190a, 290a and the N-doped region 111b, 211b of the second device 190b, 290b can be electrically connected (e.g., by a local interconnect 160, 260, as shown in FIGS. 1A and 2A, or by a combination of contacts 161, 261 and higher level metal wiring 162, 262, as shown in FIGS. 1B and 2B) such that the first device 190a, 290a is electrically connected to the second device 190b, 290b.

More specifically, referring to FIGS. 1A-1F, the embodiments 100A-100F of the IC structure can include one or more N-wells 102. For purposes of this disclosure, an N-well refers to a dopant implant region, which is in the semiconductor substrate 101 and which is doped with an N-type dopant so as to have N-type conductivity. In these embodiments, adjacent N-wells can be physically separated and electrically isolated from each other by an isolation region 103. The isolation region 103 can be, for example, a P-well. For purposes of this disclosure, a P-well refers to a dopant implant region, which is in the semiconductor substrate and which is doped with a P-type dopant so as to have P-type conductivity at a higher conductivity level than the P− substrate. Alternatively, the isolation region 103 could be a deep trench isolation (DTI) region, which includes a deep trench, which extends essentially vertically into the semiconductor substrate 101 between adjacent N-wells 102 and which is filled with one or more layers of isolation materials. It should be noted that the depth of the isolation region 103 can be the same or greater than the depth of the N-wells 102. That is, the bottom of the isolation region 103 can be at or below the level of the bottoms of the N-wells 102.

The embodiments 100A-100F of the IC structure can further include one or more pair(s) 191 of vertical diodes. In each pair 191 of vertical diodes, the first device 190a can be a vertical PIN diode and the second device 190b is a vertical NIP diode. For purposes of this disclosure, a vertical PIN diode is a diode with an anode in the semiconductor substrate, an intrinsic region in a semiconductor fin on the anode and a cathode on the semiconductor fin; whereas a vertical NIP diode is a diode with a cathode in the semiconductor substrate, an intrinsic region in a semiconductor fin on the cathode and an anode on the semiconductor fin.

Specifically, the first device 190a (i.e., the vertical PIN diode) can include a first anode 111a and, particularly, a P-doped region in an N-well 102 of the semiconductor substrate 101. The P-doped region can be, for example, P-type epitaxial semiconductor material (e.g., P+ epitaxial silicon) in a first recess in the N-well 102 of the semiconductor substrate 101. The first device 190a can also include a first semiconductor fin 104a, which is undoped and which extends vertically upward from the first anode 111a such that it has a lower end immediately adjacent to the first anode 111a and an upper end opposite the lower end. The first device 190a can further include a first cathode 112a and, particularly, N-doped epitaxial semiconductor material (e.g., N+ epitaxial silicon) immediately adjacent to the upper end of the first semiconductor fin 104a.

The second device 190b (i.e., the vertical NIP diode) can include a second cathode 111b and, particularly, an N-doped region in the same N-well 102 as and positioned laterally immediately adjacent to the first anode 111a. The N-doped region can be, for example, N-type epitaxial semiconductor material (e.g., N+ epitaxial silicon) in a second recess, which is also in the N-well 102 of the semiconductor substrate 101 and abuts the P-doped epitaxial semiconductor material in the first recess. The N-doped region can have a higher N-type conductivity level than the N-well 102. The second device 190b can further include a second semiconductor fin 104b, which is undoped and which extends vertically upward from the second cathode 111b such that it has a lower end immediately adjacent to the second cathode 111b and an upper end opposite the lower end. The second device 190b can further include a second anode 112b and, particularly, P-doped epitaxial semiconductor material (e.g., P+ epitaxial silicon) immediately adjacent to the upper end of the second semiconductor fin 104b.

The first anode 111a of the first device 190a and the second cathode 111b of the second device 190b can be electrically connected. For example, as shown in the embodiment 100A of FIG. 1A, a local interconnect 160, such as a metal silicide layer, can be positioned on the interface between the first anode 111a of the first device 190a and the second cathode 111b of the second device 190b. That is, the local interconnect 160 can have a first portion above and immediately adjacent to the top surface of the first anode 111a and a second portion above and immediately adjacent to the top surface of the second cathode 111b. Alternatively, as shown in FIG. 1B, discrete contacts 161 can extend essentially vertically through interlayer dielectric (ILD) material 145 and can land on the first anode 111a of the first device 190a and the second cathode 111b of the second device 190b, respectively, and these contacts 161 can be electrically connected by metal wiring 162 (i.e., middle of the line (MOL) and/or back end of the line (BEOL) metal wiring), thereby electrically connecting the first anode 111a to the second cathode 111b.

Figure 1D:
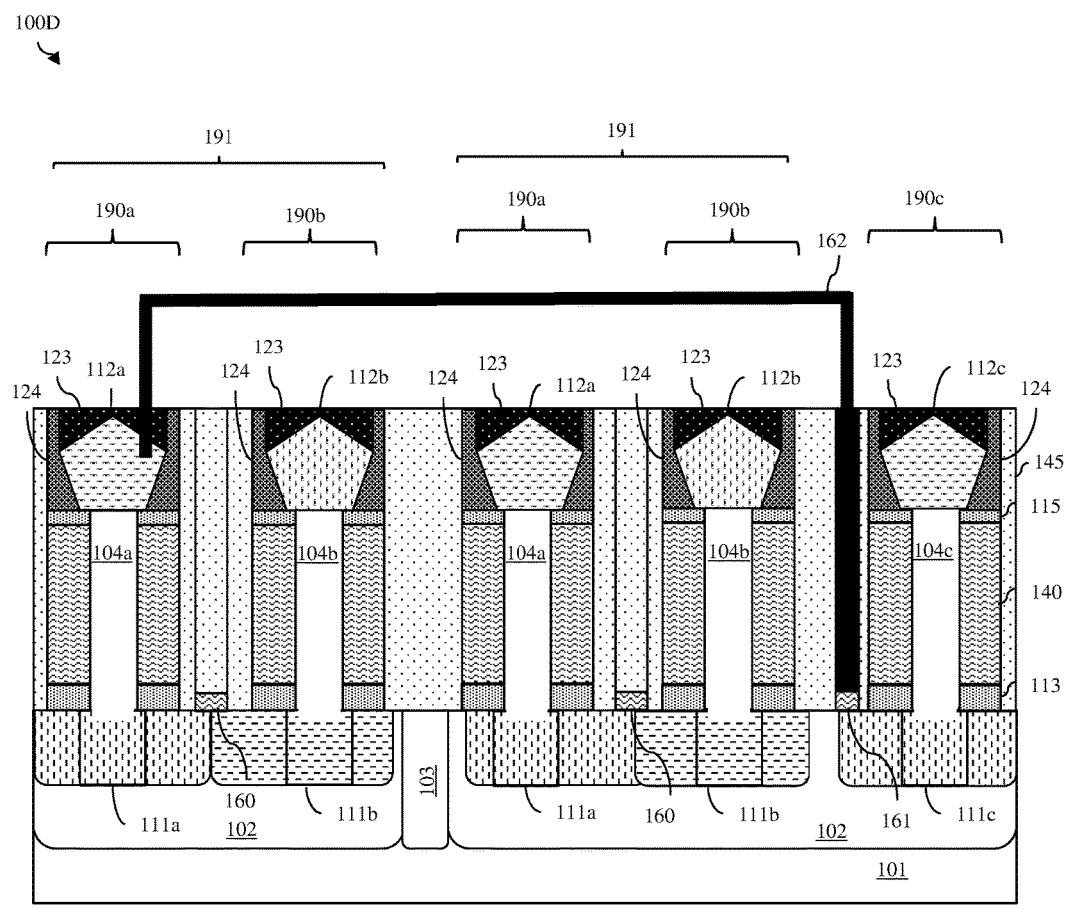
Figure 2A:
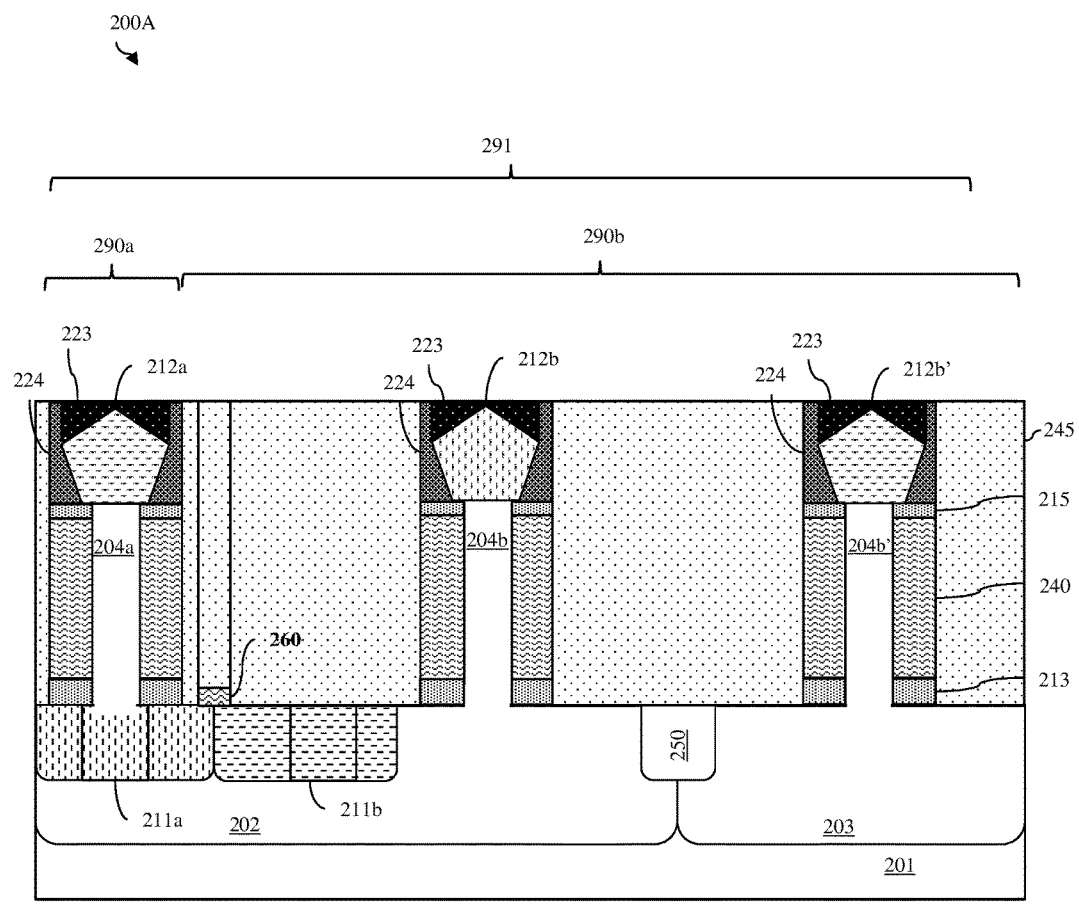
Figure 2B:
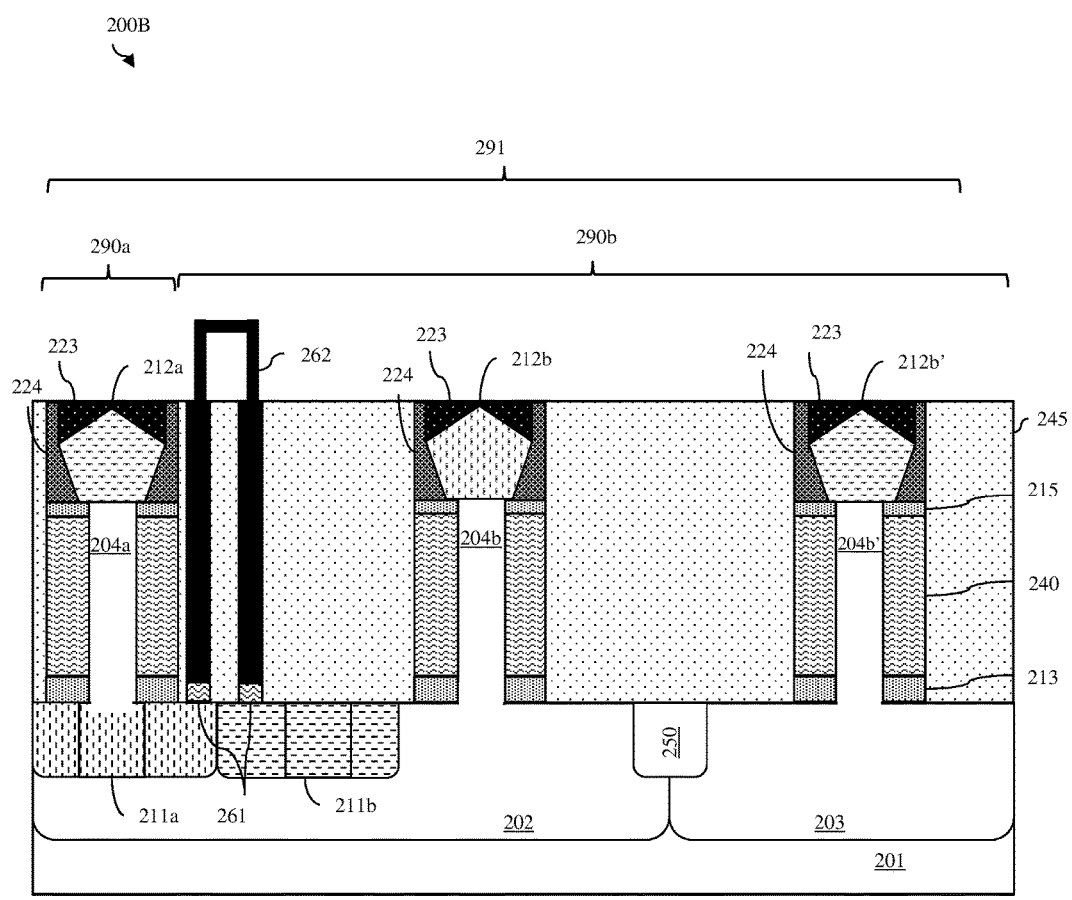

Optionally, the IC structure can include, not just a string of two vertical diodes, but a string of three vertical diodes including the pair 191 of vertical diodes discussed above and an additional vertical diode 190c, which is either on the same N-well as the pair 191 (see the embodiment 100C of FIG. 1C) or on a different N-well that the pair 191 (see the embodiment 100D of FIG. 1D). For example, the additional vertical diode 190c can be an additional vertical PIN diode and can include an additional anode 111c and, particularly, an additional P-doped region in an N-well 102 of the semiconductor substrate 101. This additional P-doped region can be, for example, P-type epitaxial semiconductor material in an additional recess, which is in the N-well of the semiconductor substrate 101 and which is physically separated from other P and/or N-doped regions. The additional vertical diode 190c can further include an additional semiconductor fin 104c, which is undoped and which extends vertically upward from the additional anode 111c such that it has a lower end immediately adjacent to the additional anode 111c and an upper end opposite the lower end. The additional vertical diode 190c can further include an additional cathode 112c and, particularly, N-doped epitaxial semiconductor material immediately adjacent to the upper end of the additional semiconductor fin 104c. As illustrated in FIG. 1C, a contact 161 can extend essentially vertically through ILD material 145 to the additional anode 111c. This contact 161 can be electrically connected to metal wiring 162 and the metal wiring 162 can also connected to a first cathode 112a of a first device 190a of a pair of devices, which is on the same N-well 102 as the additional vertical diode 190c so as to form a three-diode string. Alternatively, as illustrated in FIG. 1D, a contact 161 can extend essentially vertically through ILD material 145 to the additional anode 111c. This contact 161 can be electrically connected to metal wiring 162 and the metal wiring 162 can also be connected to a first cathode 112a of a first device 190a of a pair of devices, which is on a different N-well 102 than the additional vertical diode 190c so as to form a three-diode string. Alternatively, the additional cathode 112c could be electrically connected to the second anode 112b of a second device 190b of a pair of devices on the same or a different N-well (not shown) so as to form a three-diode string.

Figure 1E:
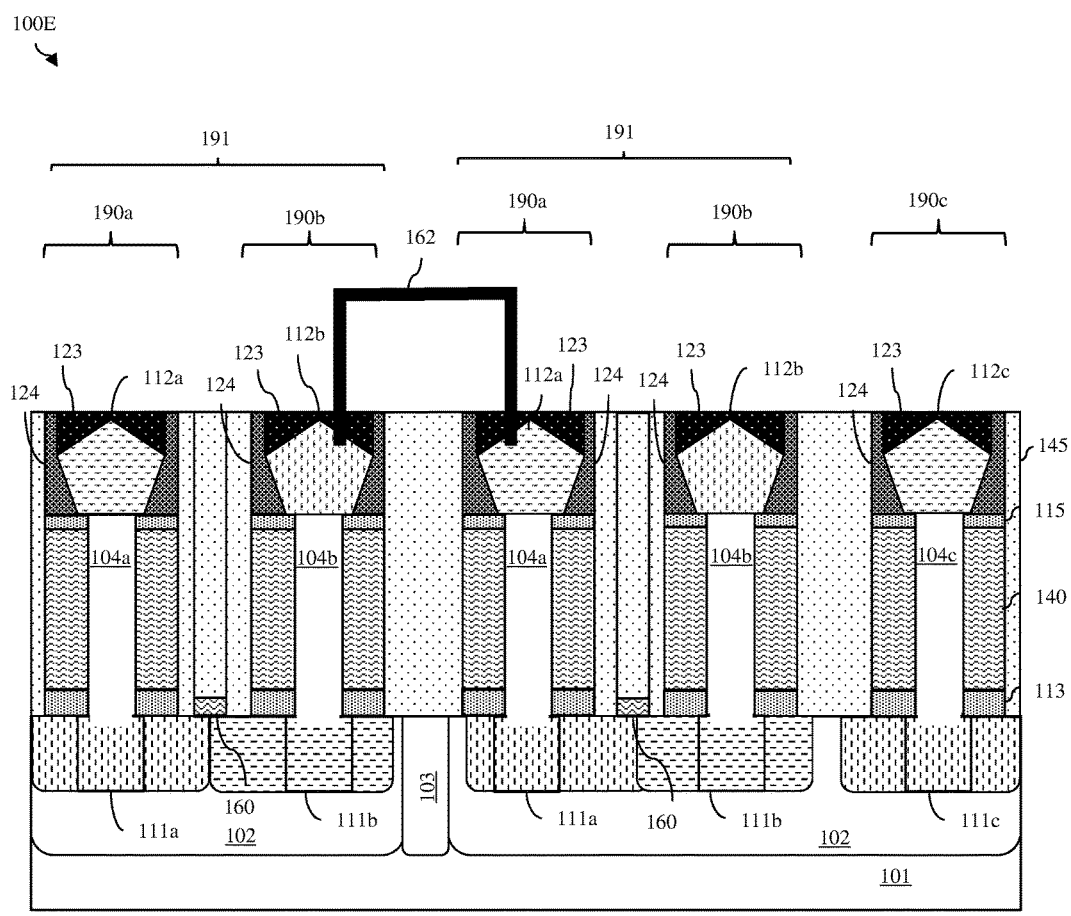

Optionally, the IC structure can include, not just a string of two or three vertical diodes, but a string of four vertical diodes including two pairs 191 of vertical diodes, as discussed above, on different N-wells 102, respectively (see the embodiment 100E of FIG. 1E). Specifically, as illustrated in FIG. 1E, the first cathode 112a of a first device 190a of one pair 191 of devices on one N-well 102 can be electrically connected by metal wiring 162 to the second anode 112b of a second device 190b of a different pair 191 of devices on a different N-well 102.

Figure 1F:
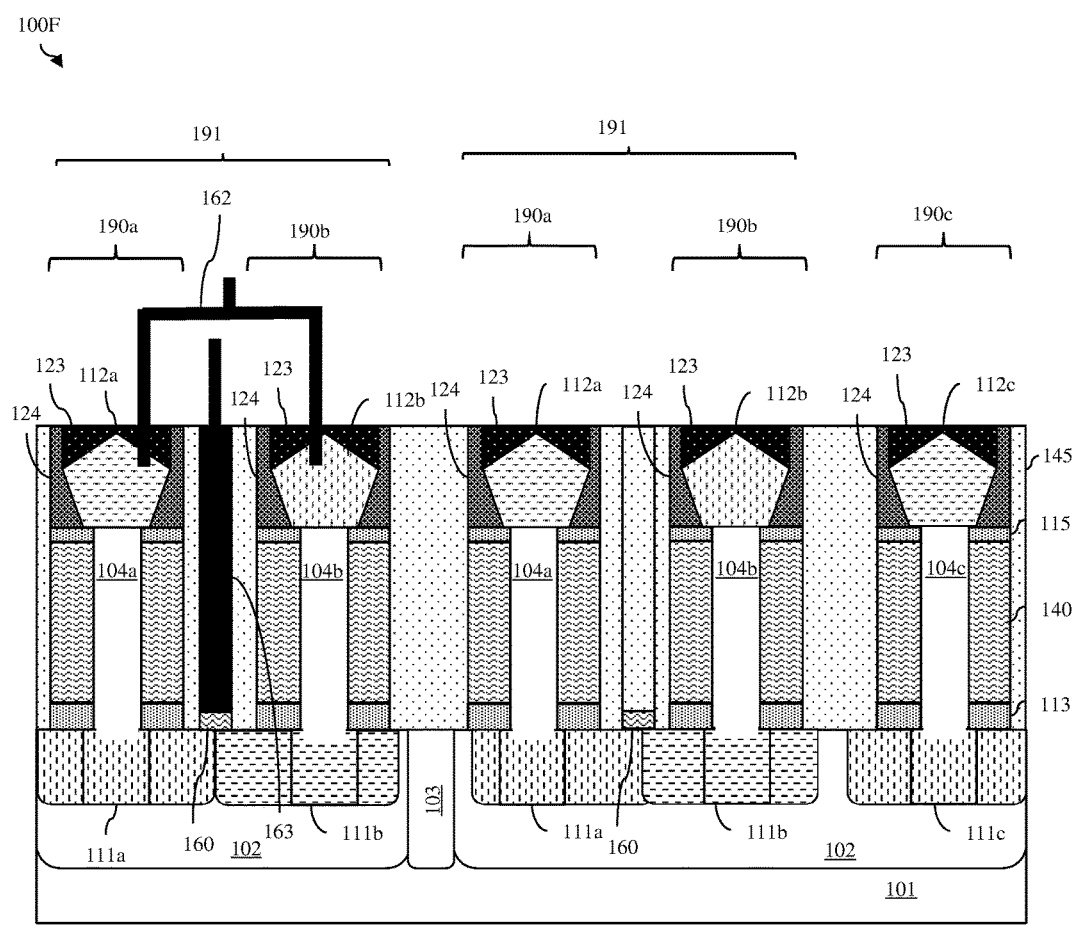

Optionally, the IC structure can include at least one string of two vertical diodes with a back-to-back connection (see the embodiment 100F of FIG. 1E). Specifically, as illustrated in FIG. 1F, in at least one pair 191 of vertical diodes, as discussed above, the output of one vertical diode is connected to the input of the other vertical diode and vice versa. That is, in a given pair 191, the first anode 111a of the first device 190a is electrically connected (e.g., by a local interconnect 160) to the second cathode 111b of the second device 190b. Additionally, in the same pair 191, the second anode 112b of the second device 190b is electrically connected by metal wiring 162 to the first cathode 112a of the first device 190a. It should be noted that a node between the first anode 111a and the second cathode 111b can be electrically connected to another device (not shown) by a contact 163 that lands on the local interconnect 160. Similarly, a node between the first cathode 112a and the second anode 112b can be electrically connected to another device (not shown) through the metal wiring 162.

Referring to FIGS. 2A-2B, the embodiments 200A-200B of the IC structure can include both an N-well 202 and a P-well 203, which is positioned laterally immediately adjacent to (i.e., abutting) the N-well 202. Optionally, an isolation region 250 can be in the semiconductor substrate 201 at the interface between the N-well 202 and the P-well 203. This isolation region 250 can be, for example, a shallow trench isolation (STI) region that includes a shallow trench, which extends into the semiconductor substrate 201 at the interface between the N-well 202 and P-well 203 and which is filled with one or more layers of isolation materials. It should be noted that the depth of the isolation region 250 can be less than the depths of the N-well 202 and P-well 203. That is, the bottom of the isolation region 250 can be above the level of the bottoms of the N-well 202 and P-well 203.

The embodiments 200A-200B of the IC structure can further include a pair 291 of devices including a first device 290a and a second device 290b connected in a string.

The first device 290a can be a vertical PIN diode. Specifically, the first device 290a can include a first anode 211a and, particularly, a P-doped region in an N-well 202 of the semiconductor substrate 201. The P-doped region can be, for example, P-type epitaxial semiconductor material (e.g., P+ epitaxial silicon) in a first recess in the semiconductor substrate 202. The first device 290a can further include a first semiconductor fin 204a, which is undoped and which extends vertically upward from the first anode 211a such that it has a lower end immediately adjacent to the first anode 211a and an upper end opposite the lower end. The first device 290a can further include a first cathode 212a and, particularly, N-doped epitaxial semiconductor material (e.g., N+ epitaxial silicon) immediately adjacent to the upper end of the first semiconductor fin 204a.

The second device 290b can be a silicon-controlled rectifier (SCR). Specifically, the second device 290b can include an N-doped region 211b that is in the N-well 202 and that abuts the first anode 211a of the first device 290a. The second device 290b can further include a second semiconductor fin 204b having a lower end immediately adjacent to the N-well 202 and an upper end opposite the lower end. This second semiconductor fin 204b is, specifically, positioned on the N-well 202 between and physically separated from both the N-doped region 211b and the STI region 250, which is at the interface between the N-well 202 and the P-well 203. The second device 290b can further include a second anode 212b and, particularly, P-doped epitaxial semiconductor material (e.g., P+ epitaxial silicon) immediately adjacent to the upper end of the second semiconductor fin 204b. The second device 290b can further include an additional semiconductor fin 204b' having a lower end immediately adjacent to the P-well 203 and an upper end opposite the lower end. The second device 290b can further include a second cathode 212b' and, particularly, N-doped epitaxial semiconductor material (e.g., N+ epitaxial silicon) immediately adjacent to the upper end of the additional semiconductor fin 204b'.

In the pair 291 of devices, the first anode 211a of the first device 290a and the N-doped region 211b of the second device 290b can be electrically connected. For example, as shown in the embodiment 200A of FIG. 2A, a local interconnect 260, such as a metal silicide layer, can be positioned on the interface between the first anode 211a of the first device 290a and the N-doped region 211b of the second device 290b. That is, the local interconnect 260 can have a first portion above and immediately adjacent to the top surface of the first anode 211a and a second portion above and immediately adjacent to the top surface of the N-doped region 211b. Alternatively, as shown in FIG. 2B, discrete contacts 261 can extend essentially vertically through interlayer dielectric (ILD) material 245 and can land on the first anode 211a of the first device 290a and the N-doped region 211b of the second device 290b, respectively. These contacts 261 can be electrically connected by metal wiring 262 (i.e., middle of the line (MOL) and/or back end of the line (BEOL) metal wiring) such that the regions 211a and 211b are electrically connected. Configured in this manner, the second device 290b (i.e., the SCR) can, during operation, be triggered by the first device 290a and the string can function as a vertical diode-triggered silicon-controlled rectifier (VDTSCR).

It should be noted that since, as discussed in greater detail below with regard to the method embodiments, the IC structure embodiments 100A-100F and 200A-200B described above and illustrated in FIGS. 1A-1F and FIGS. 2A-2B, could be formed concurrently with the formation of vertical field effect transistors (VFETs), each of the embodiments of the IC structure can further include non-contacted, non-functional gate structures 140, 240 adjacent to the sidewalls of each semiconductor fin 104a-104c, 204a-204b'. As with any contacted, functional gate structures of VFETs, these non-contacted, non-functional gate structures 140, 240 can include a gate dielectric layer positioned laterally immediately adjacent to vertical surfaces of the semiconductor fins and a gate conductor layer positioned laterally immediately adjacent to the gate dielectric layer. Lower dielectric spacers 113, 213 can electrically isolate the gate structures 140, 240 from doped semiconductor material in the semiconductor substrate 101, 201 adjacent to the lower ends of the semiconductor fins and upper dielectric spacers 115, 215 can electrically isolate the non-functional gate structures 140, 240 from doped semiconductor material adjacent to the upper ends of the semiconductor fins. ILD material 145, 245 can further electrically isolate the gate structures 140, 240 from each other as well as from other devices and interconnects.

Also disclosed herein are method embodiments for forming the above-described integrated circuit (IC) structure embodiments 100A-100F and 200A-200B, shown in FIGS. 1A-1F and in FIGS. 2A-2B, respectively.

Figure 3:
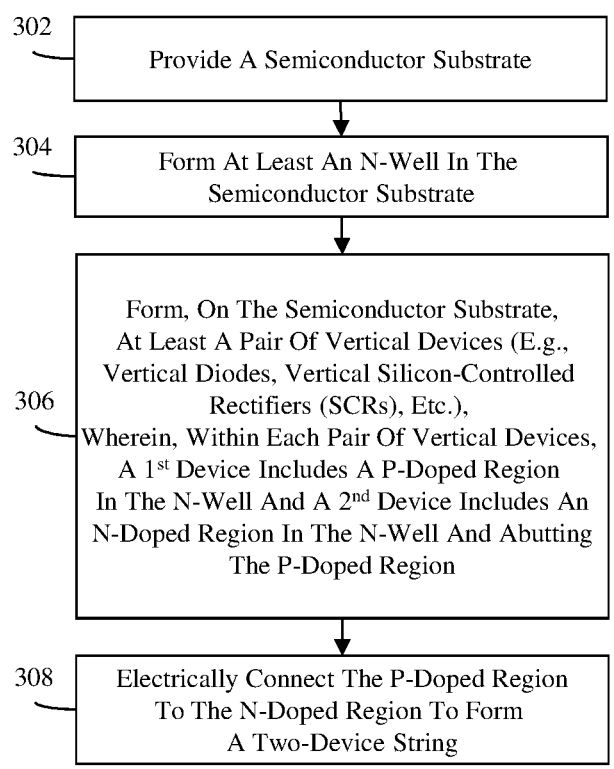
FIG. 3 is a flow diagram illustrating a method of forming an IC structure.

Generally, as illustrated in the flow diagram of FIG. 3, the method can include providing a semiconductor substrate (see process 302) and forming at least an N-well in the semiconductor substrate (see process 304). A pair of devices can then be formed on the semiconductor substrate concurrently with the formation of vertical field effect transistors (VFETs) (see process 306). This pair of devices can be formed so as to include, for example, a first device and a second device. The first device can be a vertical diode. Specifically, the first device can include a first anode and, particularly, a P-doped region in the N-well of the semiconductor substrate. The first device can further include a first semiconductor fin having a lower end immediately adjacent to the first anode and an upper end opposite the lower end. The first device can further include a first cathode and, particularly, N-doped epitaxial semiconductor material immediately adjacent to the upper end of the first semiconductor fin. The second device can be another vertical device (e.g., another vertical diode, a silicon-controlled rectifier (SCR) with vertically-oriented features, or any other suitable vertical device). In any case, the second device can include an N-doped region in the N-well of the semiconductor substrate and positioned laterally immediately adjacent to the first anode of the first device (i.e., abutting the P-doped region in the N-well). The method can further include electrically connecting the first anode of the first device (i.e., the P-doped region) to the N-doped region of the second device (e.g., by forming a local interconnect or by forming contacts and wiring) (see process 308).

Figure 4:
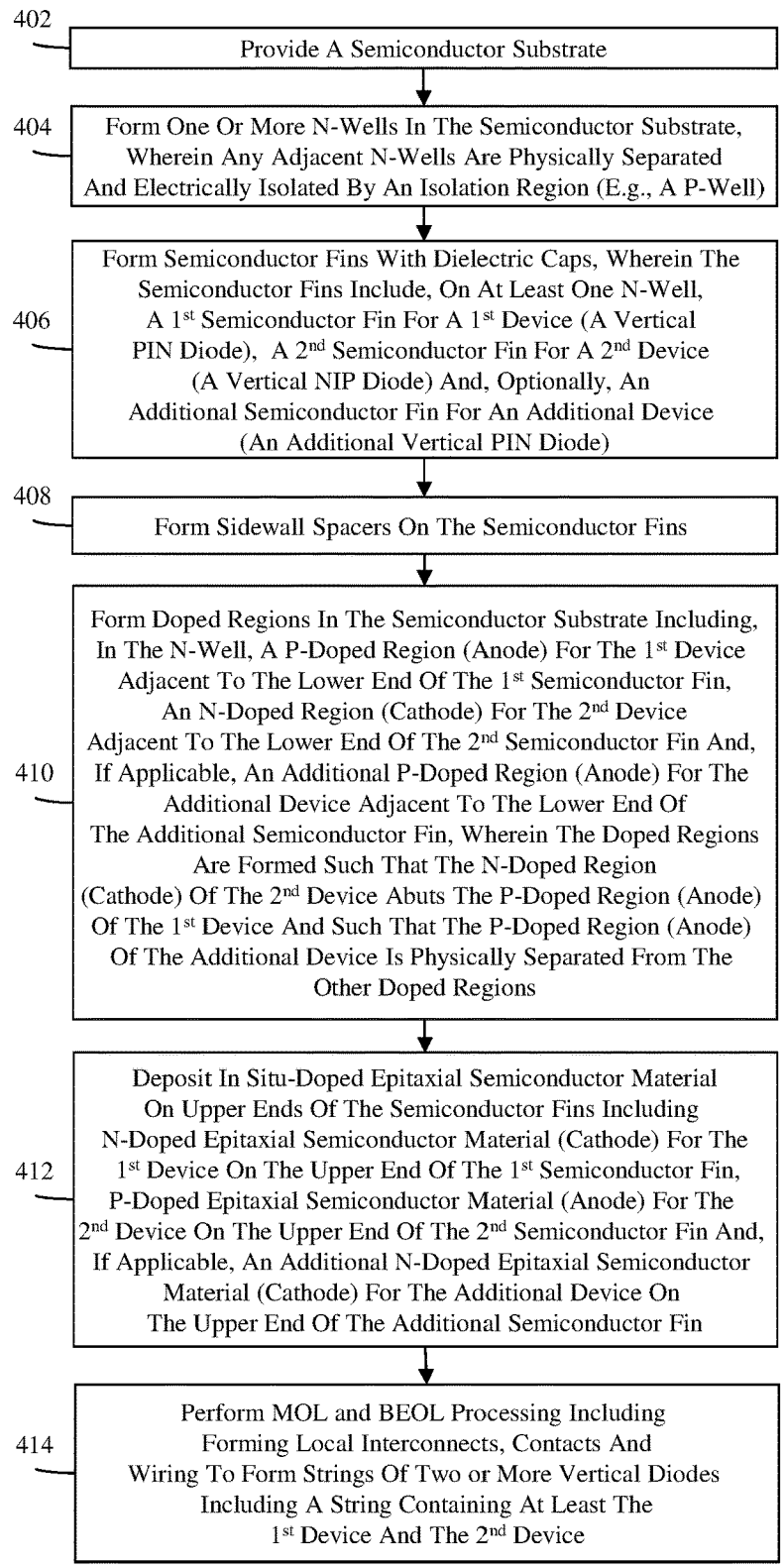
FIG. 4 is a flow diagram illustrating a method of forming, specifically, the IC structure embodiments 100A-100F of FIGS. 1A-1F.

More specifically, as illustrated in the flow diagram of FIG. 4, the following processes can be performed in order to form the IC structure embodiments 100A-100F described in detail above and shown in FIGS. 1A-1F. In this case, the method can include providing a semiconductor substrate 101 (see process 402 and FIG. 5). The semiconductor substrate 101 can be a bulk semiconductor substrate (e.g., a bulk silicon substrate), as illustrated. Alternatively, the semiconductor substrate 101 can be a semiconductor layer above an insulator layer of a semiconductor-on-insulator wafer (e.g., a silicon layer above a buried oxide layer of a silicon-on-insulator (SOI) wafer). Optionally, the semiconductor substrate 101 can be doped so as to have P-type conductivity at a relatively low conductivity level (i.e., so as to be a P−substrate).

Figure 5:
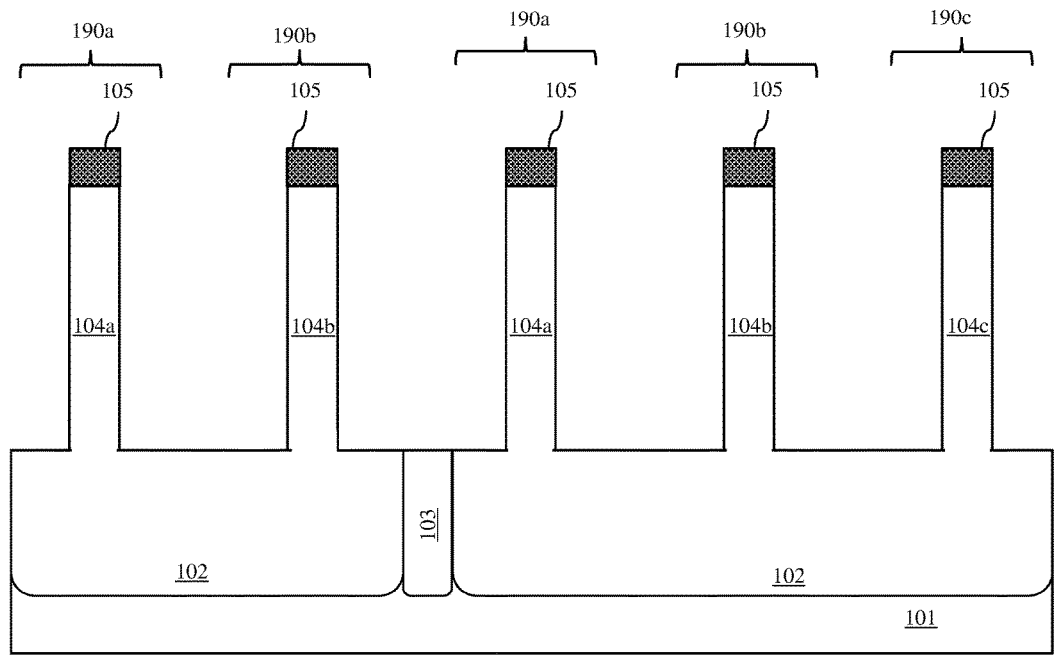
FIGS. 5-13 are cross-section diagrams illustrating a partially completed IC structure formed according to the flow diagram of FIG. 4.

The method can further include forming one or more N-wells 102 in the semiconductor substrate 101 such that adjacent N-wells 102 are physically separated and electrically isolated by an isolation region 103 (see process 404 and FIG. 5). The isolation region 103 can be formed, for example, as a P-well. Techniques for forming N and P-wells (e.g., using multiple masked dopant implantation processes) are well known in the art and, thus, these techniques have been omitted from this specification in order to allow the reader to focus on the salient aspects of the disclosed method. In any case, the N-well(s) 102 and isolation region 103 should be formed at process 404 such that the depth of the isolation region 103 is the same or greater than the depth of the N-wells 102 (i.e., such that the bottom of the isolation region 103 is at or below the level of the bottoms of the N-wells 102).

The method can further include forming semiconductor fins in the upper portion of the semiconductor substrate 101 such that the semiconductor fins include, on at least one N-well 102, a first semiconductor fin 104a for a first device 190a (e.g., a vertical PIN diode), a second semiconductor fin 104b for a second device 190b (e.g., a vertical NIP diode) and, optionally, an additional semiconductor fin 104c for an additional device 190c (e.g., an additional vertical PIN diode) (see process 406 and FIG. 5). Optionally, at process 406, additional semiconductor fins, for example, for P-type and N-type vertical field effect transistors (VFETs) can be concurrently formed elsewhere on the semiconductor substrate. For purposes of this disclosure, a semiconductor fin is a relatively tall, thin, essentially rectangular-shaped semiconductor body. Techniques for forming semiconductor fins (e.g., lithographic patterning and etch techniques, sidewall image transfer techniques, etc.) are well known in the art and, thus, the details of such techniques have been omitted from this specification in order to allow the reader to focus on the salient aspects of the disclosed methods. As illustrated, each of the semiconductor fins can be formed so as to have a sacrificial dielectric cap 105.

Figure 6:
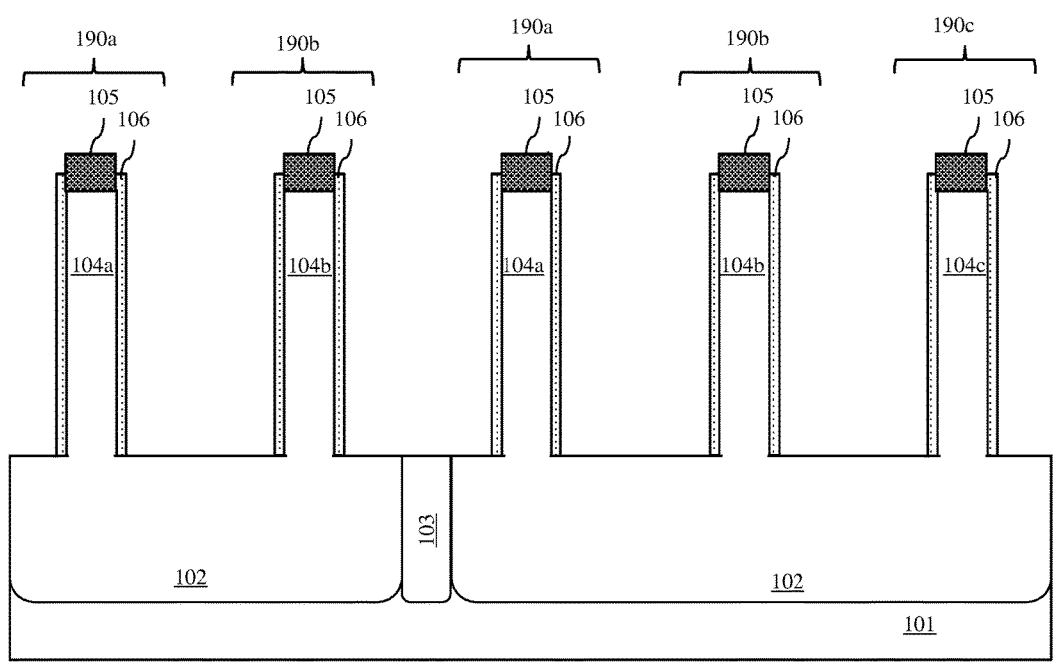

The method can further include forming sacrificial dielectric sidewall spacers 106 on vertical sidewalls of the semiconductor fins (see process 408 and FIG. 6). The sidewall spacers 106 can be formed, for example, using conventional sidewall spacer formation techniques.

Figure 7:
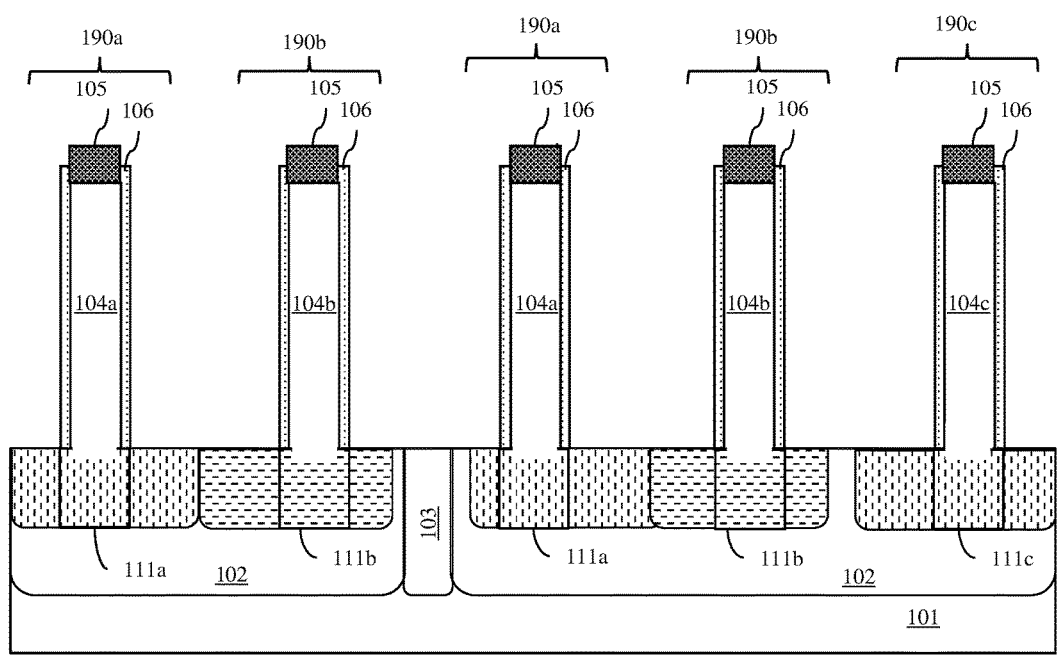

After the sacrificial dielectric sidewall spacers 106 are formed, doped regions can be formed in the semiconductor substrate and these doped regions can include at least the following in each N-well 102: a P-doped region and, particularly, a first anode 111a for the first device 190a adjacent to the lower end of the first semiconductor fin 104a; an N-doped region and, particularly, a second cathode 111b for the second device 190b adjacent to the lower end of the second semiconductor fin 104b and abutting the first anode 111a; and, if applicable, an additional P-doped region and, particularly, an additional anode 111c for the additional device 190c adjacent to the lower end of the additional semiconductor fin 104c and physically separated from the other doped regions 111a-111b (see process 410 and FIG. 7).

To form such doped regions at process 410, a series of masked recess etch and in situ-doped epitaxial semiconductor deposition processes can be performed. For example, a first mask can be formed so as to have openings that are aligned over and wider than the first semiconductor fin 104a on each N-well 102 and, if applicable, aligned over and wider than the additional semiconductor fin 104c on each N-well. An etch process (e.g., a selective anisotropic etch process) can then be performed in order to etch exposed portions of the semiconductor substrate and, thereby form in each N-well 102 a first recess adjacent to the lower end of the first semiconductor fin 104a and, if applicable, an additional recess adjacent to the lower end the additional semiconductor fin 104c. P-doped epitaxial semiconductor material (e.g., P+ epitaxial silicon) can then be deposited so as to fill these recesses, thereby forming in each N-well 102 the first anode 111a for the first device 190a and, if applicable, the additional anode 111c for the additional device 190c. It should be noted that these same processes can be performed concurrently with the formation of lower P-type source/drain regions for P-type VFETs adjacent to the lower ends of semiconductor fins elsewhere on the semiconductor substrate. The first mask can then be removed and a second mask can be formed so as to have openings that are aligned over and wider than the second semiconductor fin 104b on each N-well 102. The second mask can be formed such that the opening over each second semiconductor fin 104b overlaps the previously formed first anode 111a for the first device 190a on that same N-well 102 (but not the previously formed additional anode 111c). An etch process (e.g., a selective anisotropic etch process) can then be performed in order to etch exposed portions of the semiconductor substrate and, thereby form in each N-well 102 a second recess adjacent to the lower end of each second semiconductor fin 104b. N-doped epitaxial semiconductor material (e.g., N+ epitaxial silicon) can then be deposited so as to fill these recesses, thereby forming in each N-well the second cathode 111b for the second device 190b abutting the first anode 111a of the adjacent first device 190a. It should be noted that these same processes can be performed concurrently with the formation of lower N-type source/drain regions for N-type VFETs adjacent to the lower ends of semiconductor fins elsewhere on the semiconductor substrate.

Following formation of the first anode 111a, the second cathode 111b, and, if applicable, the additional anode 111c on each N-well, additional processing can be performed in order to complete the vertical diodes (i.e., to complete the first device 190a, the second device 190b and, if applicable, the additional device 190c on each N-well). The additional processing can include the deposition of in situ-doped epitaxial semiconductor material on upper ends of the semiconductor fins including at least the following: deposition of N-doped epitaxial semiconductor material (e.g., N+ epitaxial silicon) on the upper end of the first semiconductor fin 104a to form a first cathode 112a for the first device 190a; deposition of P-doped epitaxial semiconductor material (e.g., P+ epitaxial silicon) on the upper end of the second semiconductor fin to form a second anode 112b for the second device 190b; and, if applicable, deposition of additional N-doped semiconductor material (N+ epitaxial silicon) on the upper end of the additional semiconductor fin 104c to form an additional cathode 112c for the additional device 190c (see process 412). Furthermore, this additional processing can be integrated with processes used to complete VFETs.

For example, this additional process can include removal of the sacrificial dielectric sidewall spacers 106. Then, a first dielectric spacer layer 113 (also referred to herein as a lower dielectric spacer layer) can be deposited and recessed so as to cover exposed surfaces of the semiconductor substrate 101 (including exposed surfaces of the doped regions, the isolation region and the wells) and so as to laterally surround a bottom portion of each semiconductor fin (see FIG. 8). It should be noted that if the sacrificial dielectric sidewall spacers 106 were not previously removed, they can be recessed along with the first dielectric spacer layer 113 so that vertical surfaces of the semiconductor fins are exposed.

Figure 8:
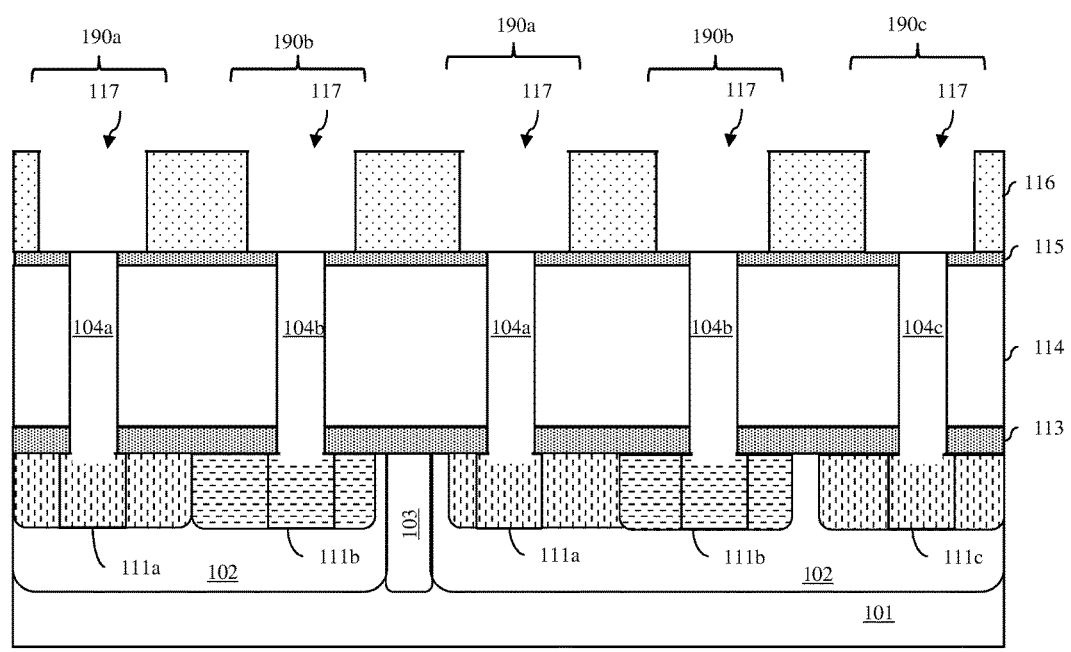

Next, a sacrificial gate layer 114 can be formed above the first dielectric spacer layer 113 so as to laterally surround each semiconductor fin (see FIG. 8). For example, a thin conformal dielectric layer can be deposited followed by deposition of a blanket sacrificial layer (e.g., a polysilicon layer, amorphous silicon layer or any other suitable sacrificial material that can be selectively and isotropically etched away during subsequent processing). These layers can then be recessed so that the resulting sacrificial gate layer 114 is above the first dielectric spacer layer 113 and laterally surrounds each semiconductor fin. A second dielectric spacer layer 115 (also referred to herein as an upper dielectric spacer layer) can be deposited and recessed so that the sacrificial gate layer 114 remains covered and so that upper ends of the semiconductor fins are laterally surrounded by the second dielectric spacer layer 115 (see FIG. 8). It should be noted that the process used to recess the second dielectric spacer layer 115 can also be used to remove the sacrificial dielectric caps 105 from the tops of the semiconductor fins.

An additional blanket sacrificial layer 116 (e.g., a silicon dioxide layer) can be deposited over the partially completed structure and openings 117 can be formed (e.g., lithographically patterned and etched) in the additional blanket sacrificial layer 116 such that each opening is aligned above a corresponding one of the semiconductor fins, is wider than that semiconductor fin and extends vertically down to the second dielectric spacer layer 115. Thus, the tops of the semiconductor fins are exposed within the openings 117. Optionally, the semiconductor fins can be recessed within the openings 117 such that only the top surfaces of the semiconductor fins are exposed.

Figure 9:
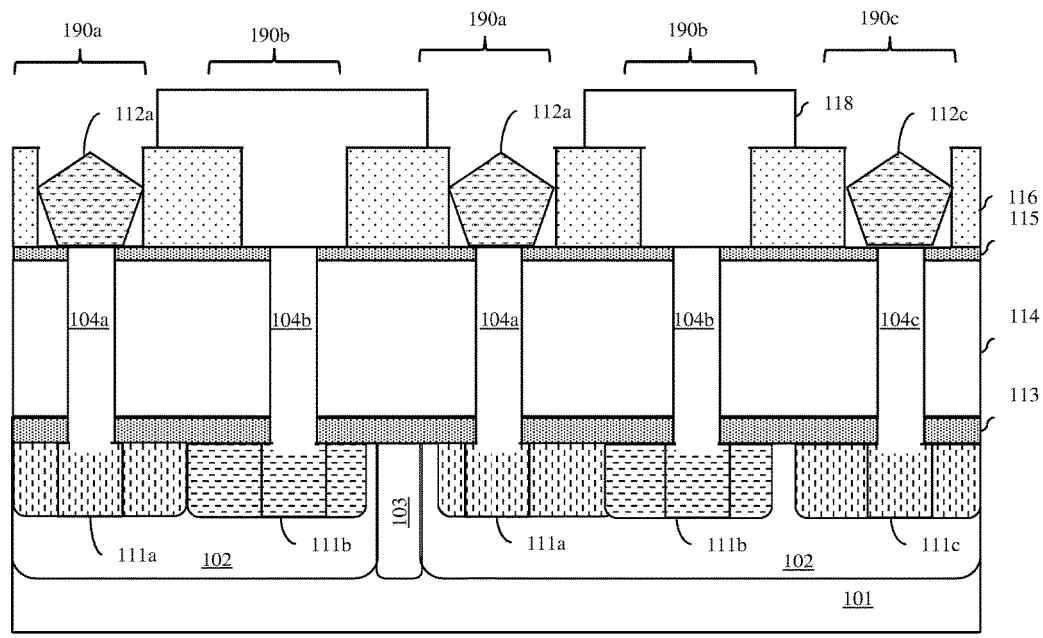

A mask layer 118 can then be deposited and patterned with cathode openings for vertical PIN diodes (e.g., for the first device 190a and any additional device 190c on each N-well 102), as shown in FIG. 9. The same mask layer 118 can also be patterned with N-type source/drain openings for N-type VFETs (not shown). N-doped epitaxial semiconductor material (e.g., N+ epitaxial silicon) can then be deposited in the cathode openings so as to form a first cathode 112a for the first device 190a adjacent to the upper end of the first semiconductor fin 104a on each N-well 102 and so as to form an additional cathode 112c for the additional device 190c (if applicable) on each N-well 102, as shown in FIG. 9. This same epitaxial deposition process can also be used to form upper N-type source/drain regions for N-type VFETs (not shown). The mask layer 118 can then be selectively removed.

Figure 10:
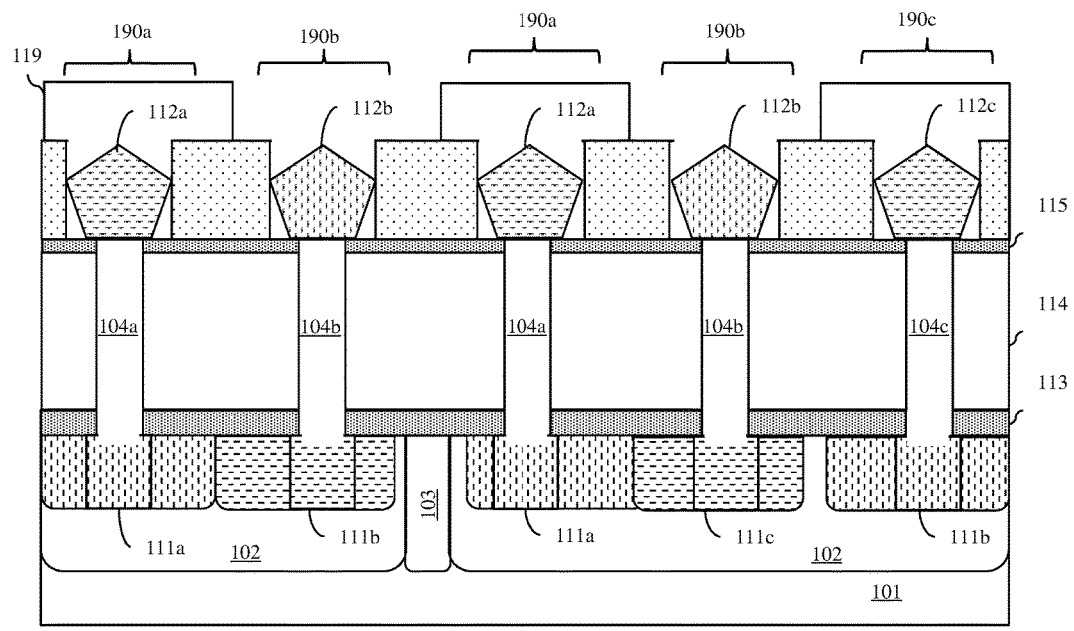

Next, another mask layer 119 can be deposited and patterned with anode openings for vertical NIP diodes (e.g., for the second device 190b on each N-well 102), as shown in FIG. 10. The same mask layer 119 can also be patterned with P-type source/drain openings for P-type VFETs (not shown). P-doped epitaxial semiconductor material (e.g., P+ epitaxial silicon) can then be deposited in the anode openings so as to form a second anode 112b for the second device 190b adjacent to the upper end of the second semiconductor fin 104b on each N-well 102, as shown in FIG. 10. This same epitaxial deposition process can also be used to form upper P-type source/drain regions for P-type VFETs (not shown). The mask layer 119 can then be selectively removed.

Figure 11:
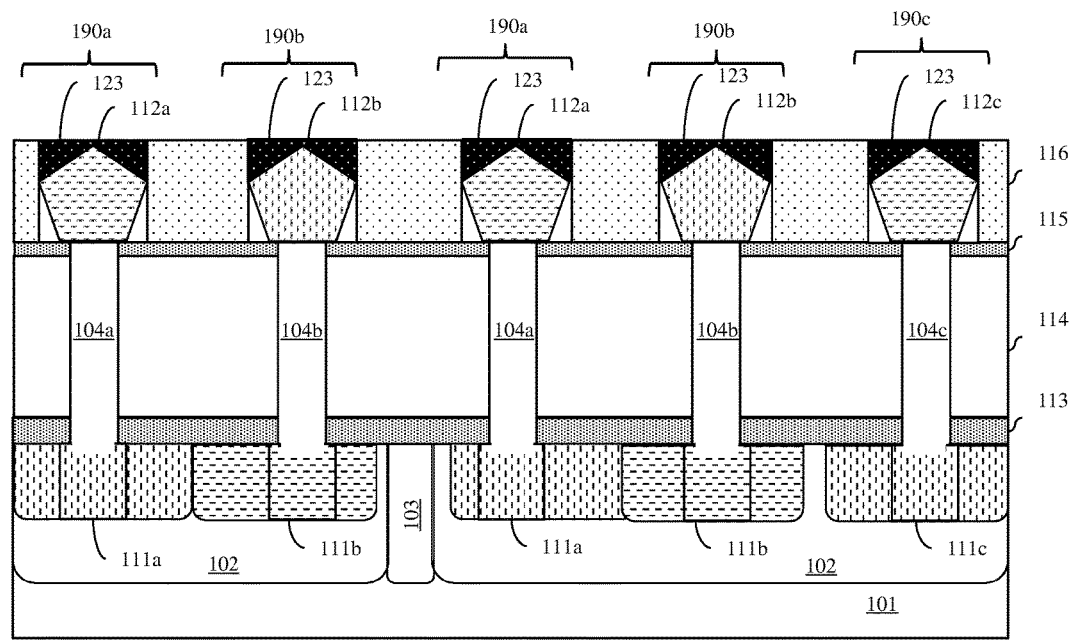
Figure 12:
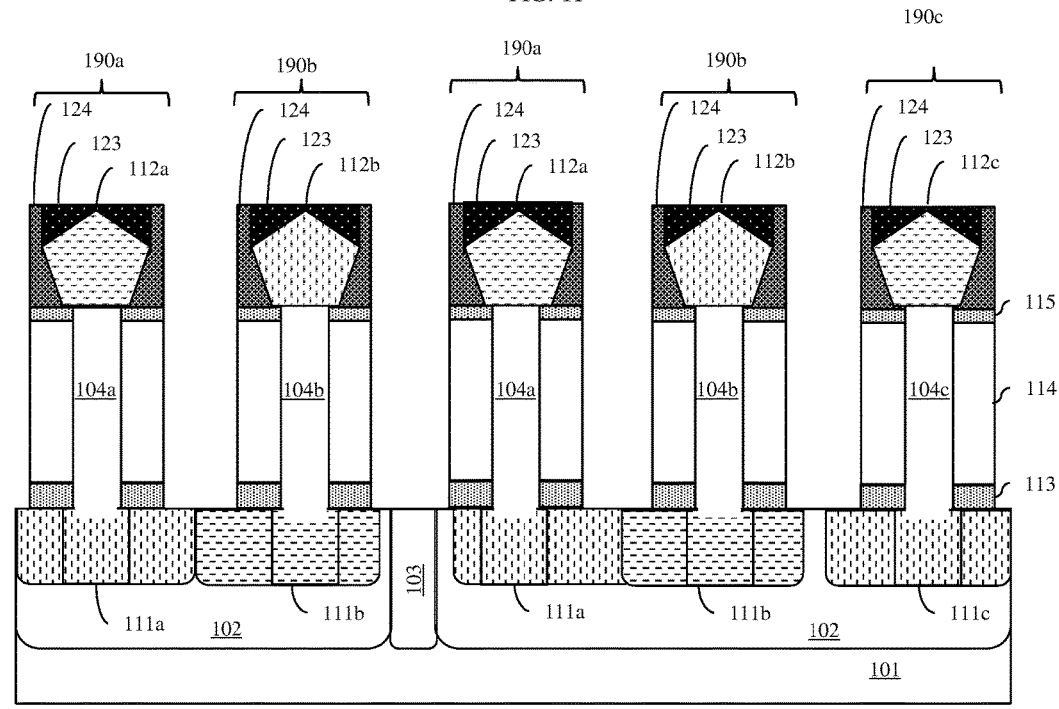

Subsequently, protective dielectric caps 123 can be formed to cover the top surfaces of the first cathode 112a of each first device 190a, the second anode 112b of each second device 190b and, if applicable, the additional cathode 112c of any additional devices 190c (see FIG. 11). This same process can also be used to form protective dielectric caps on any upper source/drain regions of any VFETs (not shown). Next, the additional blanket sacrificial layer 116 can be selectively removed and protective dielectric sidewall spacers 124 can be formed on the second dielectric spacer layer 115 laterally surrounding each first cathode 112a, second anode 112b, and, if applicable, each additional cathode 112c above each N-well (see FIG. 12). This same process can also be used to form protective dielectric spacers on any upper source/drain regions of any VFETs (not shown).

It should be noted that the first dielectric spacer layer 113 and the second dielectric spacer layer 115 can be made of the same dielectric material or different dielectric materials (e.g., low-K dielectric material(s)). The protective dielectric sidewall spacers 124 can be made of a different dielectric material than the spacer layers and the protective dielectric caps 123 can be made of a different dielectric material than the protective dielectric sidewall spacers 124.

Figure 13:
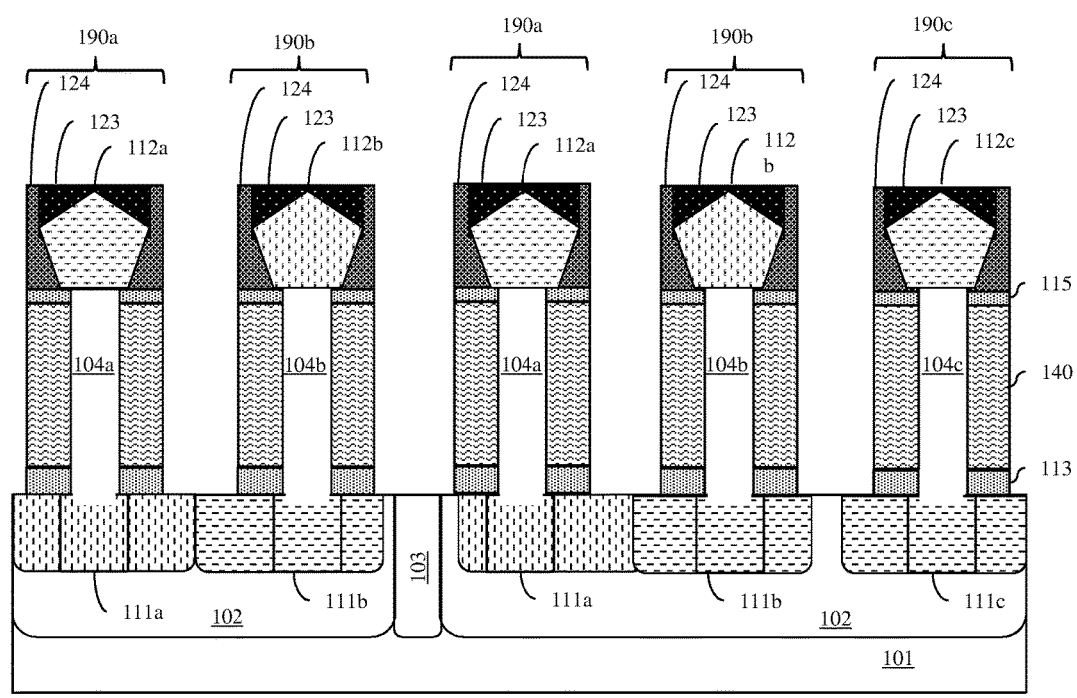

Next, replacement metal gate processing can be performed. It should be understood that, while gates are not required components of diodes, the following processes can be performed to form non-functional gates on the vertical diodes when integration of vertical diode formation and VFET formation is desirable. Specifically, using the protective dielectric caps 123 and protective dielectric sidewall spacers 124 as a mask pattern, an anisotropic etch process can be performed to pattern the second dielectric spacer layer 115 and the sacrificial gate layer 114 (see FIG. 12). The remaining portions of the sacrificial gate layer 114 can then be selectively removed (e.g., using a selective isotropic etch process), thereby creating cavities around the semiconductor fins between the first and second dielectric spacer layers. A replacement gate, such as a replacement metal gate (RMG), can then be formed within each cavity around each semiconductor fin. That is, a conformal gate dielectric layer can be deposited and a gate conductor layer can be deposited on the conformal gate dielectric layer. Another anisotropic etch process can then be performed, again using the combination of the protective dielectric cap 123 and protective dielectric sidewall spacer 124 around each upper anode, upper cathode and upper source/drain region as a mask pattern, in order to pattern the gate conductor and gate dielectric layers (see FIG. 13). While such a gate structure is necessary for VFET function, the gates formed adjacent to the first semiconductor fin 104a, the second semiconductor fin 104b and, if applicable, the additional semiconductor fin 104c on each N-well 102 will not be contacted and, thus, will be non-functional gate structures 140.

It should be understood that the processes described above and illustrated in FIGS. 8-13 are not intended to be limiting. The processes used to complete the vertical diodes and, particularly, the first device 190a, the second device 190b and, if applicable, the additional device 190c on each N-well 102 for the IC structure embodiments 100A-100F shown in FIGS. 1A-1F can be integrated with any known VFET processing technique as long as the following conditions are met: (1) any gate structures formed adjacent to the semiconductor fins of vertical diodes are not contacted and, thus, non-functional gate structures; (2) upper P-type source/drain regions for P-type VFETs and second anode(s) 112b for the second device(s) 190b (i.e., for vertical NIP diode(s)) are formed concurrently and (3) upper N-type source/drain regions for N-type VFETs and first cathode(s) 112a of first device(s) 190a and any additional cathode(s) 112c of additional device(s) 190c (i.e., vertical PIN diode(s)) are formed currently.

In any case, following gate structure formation, middle of the line (MOL) and back end of the line (BEOL) processing can be performed in order to complete the various different embodiments 100A-100F of the IC structure (see process 414 and FIGS. 1A-1F). This MOL and BEOL processing can include, for example, deposition of interlayer dielectric (ILD) material 145 so as to laterally surround and electrically isolate the non-functional gate structures 140.

This MOL and BEOL processing can further include the formation of local interconnect(s) 160 to electrically connect the first anode 111a in each N-well 102 to the second cathode 111b in the same N-well 102, thereby forming two-diode string(s) including the first device 190a and the adjacent second device 190b (see FIG. 1A). For example, above each N-well, an opening can be formed (e.g., lithographically patterned and etched) such that it extends essentially vertically through the ILD material 145 between the first semiconductor fin 104a and the second semiconductor fin 104b and such that it exposes adjacent portions of the first anode 111a and the second cathode 111b. A metal silicide layer can be formed at the bottom of the opening and in contact with the exposed adjacent portions of the first anode 111a and the second cathode 111b. Additional ILD material can then be deposited and polished (e.g., using a chemical mechanical polishing (CMP) process), thereby refilling the opening. Alternatively, this MOL and BEOL processing can include both the formation of discrete contacts 161 that land on the first anode 111a and the second cathode 111b in an N-well 102 and the formation of metal wiring 162 to electrically connect the contacts 161, thereby forming a two-diode string including the first device 190a and the adjacent second device 190b (see FIG. 1B).

Optionally, this MOL and BEOL processing can also include the formation of a contact 161 that lands on an additional anode 111c in an N-well 102 and metal wiring 162 that electrically connects that contact 161 to a first cathode 112a of a first device 190a, thereby forming a three-diode string (see FIGS. 1C and 1D). It should be noted that in FIG. 1C the first, second and additional devices in the three-diode string are all on the same N-well; wherein in FIG. 1D the first and second devices in the three-diode string are on one N-well and the additional device 190c is on a different N-well.

Optionally, this MOL and BEOL processing can further include the formation of metal wiring 162 to electrically connect a first cathode 112a of a first device 190a in a two-diode string to a second anode 112b of a second device 190b in another two-diode string, thereby forming a four-diode string (see FIG. 1E).

Optionally, this MOL and BEOL processing can include the formation of a back-to-back connection in a two-diode string (see FIG. 1F). For example, in addition to electrically connecting a first anode 111a of a first device 190a to a second cathode 111b of a second device 190b with a local interconnect 160, the MOL and BEOL processing can include forming metal wiring 162 that electrically connects a second anode 112b of the second device 190b to a first cathode 112a of the first device 190a. It should be noted that during MOL and BEOL processing a contact 163 can also be formed on the local interconnect 160 so that a node between the first anode 111a of the first device 190a and the second cathode 111b of the second device 190b can be electrically connected to another device (not shown). Similarly, metal wiring 162 can also be formed so as to allow a node between the first cathode 112a of the first device 190a and the second anode 112b of the second device 190b to be electrically connected to yet another device (not shown).

Figure 14:
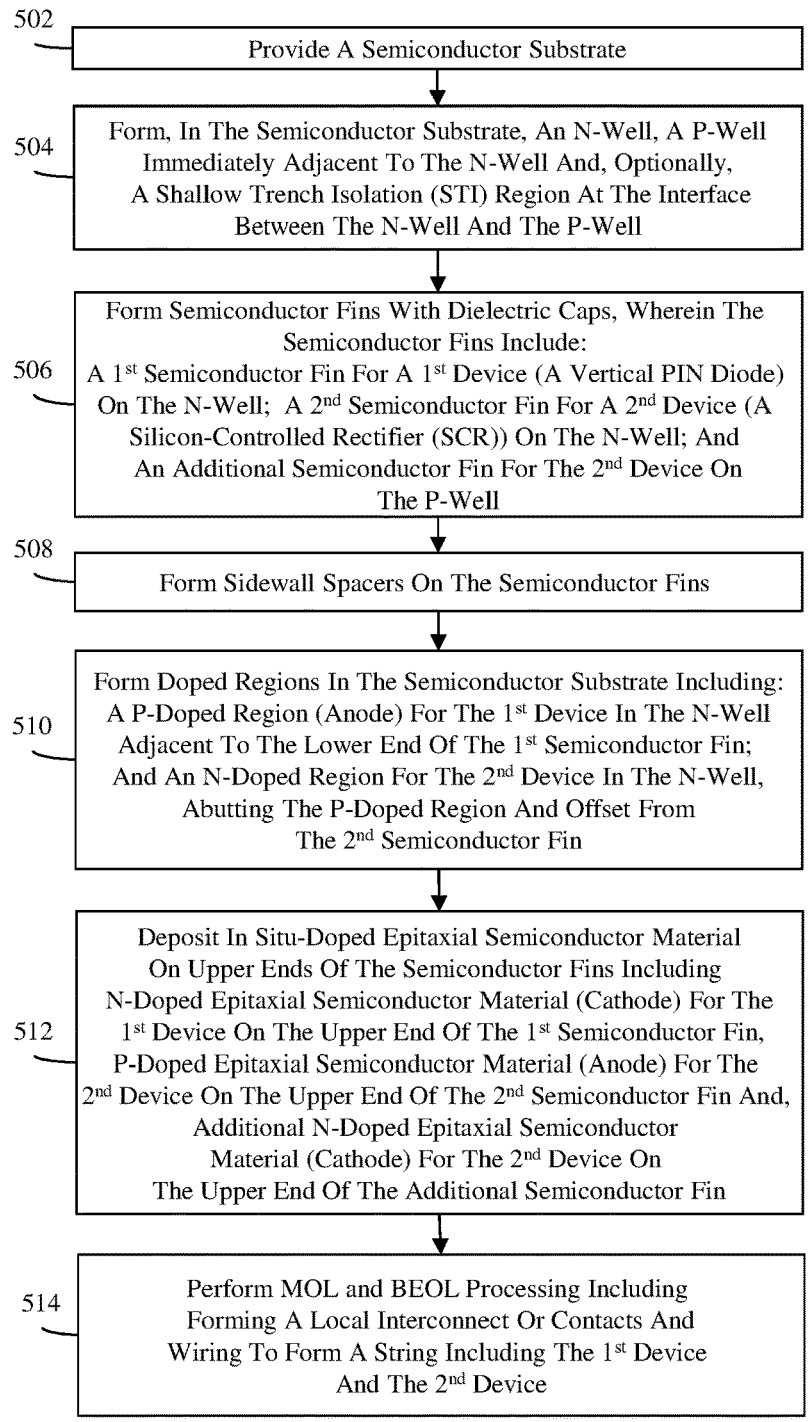
FIG. 14 is a flow diagram illustrating a method of forming, specifically, the IC structure embodiments 200A-200B of FIGS. 2A-2B.

As illustrated in the flow diagram of FIG. 14, the following processes can be performed in order to form the IC structure embodiments 200A-200B described in detail above and shown in FIGS. 2A-2B. In this method, a semiconductor substrate 201 can be provided (see process 502 and FIG. 15). The semiconductor substrate 201 can be a bulk semiconductor substrate (e.g., a bulk silicon substrate), as illustrated, or the semiconductor substrate 201 can be a semiconductor layer above an insulator layer of a semiconductor-on-insulator wafer (e.g., a silicon layer above a buried oxide layer of a silicon-on-insulator (SOI) wafer). Optionally, the semiconductor substrate 201 can be doped so as to have P-type conductivity at a relatively low conductivity level (e.g., so as to be a P– substrate).

Figure 15:
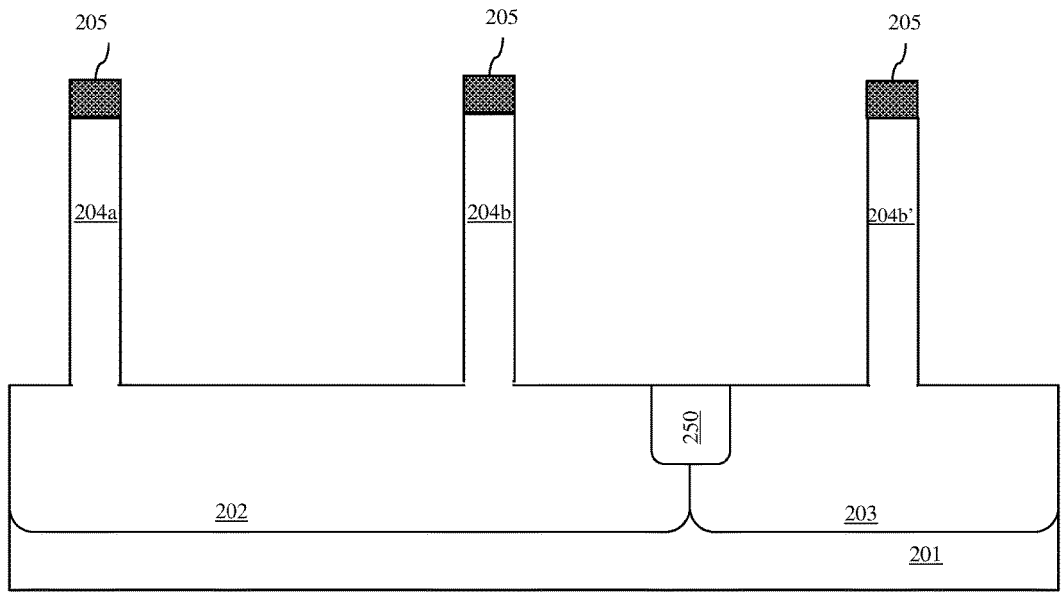
FIGS. 15-23 are cross-section diagrams illustrating a partially completed IC structure formed according to the flow diagram of FIG. 14.

The method can further include forming at least an N-well 202 in the semiconductor substrate 201, a P-well 203 in the semiconductor substrate 202 positioned laterally immediately adjacent to the N-well 202 and, optionally, an isolation region 250 at the interface between the N-well 202 and the P-well 203 (see process 504 and FIG. 15). The isolation region 250 can be formed, for example, as a shallow trench isolation (STI) region. Techniques for forming N and P-wells (e.g., using multiple masked dopant implantation processes) and techniques for forming STI regions are well known in the art and, thus, these techniques have been omitted from this specification in order to allow the reader to focus on the salient aspects of the disclosed method. In any case, the N-well 202, the P-well 203 and the isolation region 250 should be formed at process 504 such that the depth of the isolation region 250 is less than the depth of the N-well 202 and P-well 203.

The method can further include forming multiple semiconductor fins in the upper portion of the semiconductor substrate 201 (see process 506 and FIG. 15). More specifically, the semiconductor fins can be formed so as to include: for a first device 290a (vertical PIN diode), a first semiconductor fin 204a on the N-well 202; and for a second device 290b (a silicon-controlled rectifier (SCR)), a second semiconductor fin 204b on the N-well 202 and an additional semiconductor fin 204b' on the P-well 203. Optionally, additional semiconductor fins, for example, for P-type and N-type vertical field effect transistors (VFETs) can be concurrently formed elsewhere on the semiconductor substrate. As illustrated, each of the semiconductor fins can be formed so as to have a sacrificial dielectric cap 205.

Figure 16:
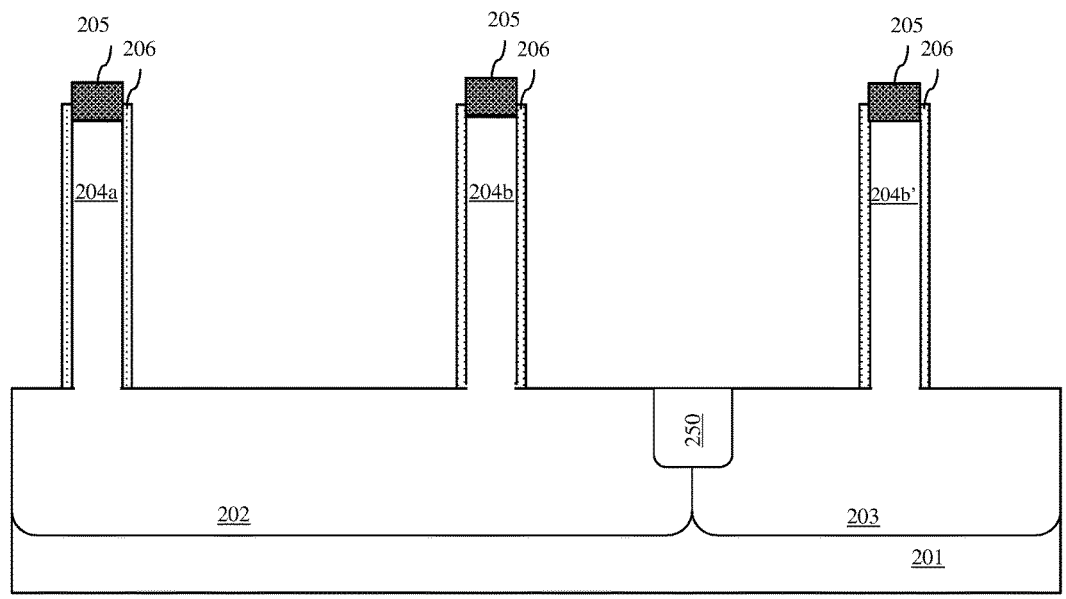

The method can further include forming sacrificial dielectric sidewall spacers 206 on the vertical sidewalls of the semiconductor fins (see process 508 and FIG. 16). The sidewall spacers 106 can be formed, for example, using conventional sidewall spacer formation techniques.

Figure 17:
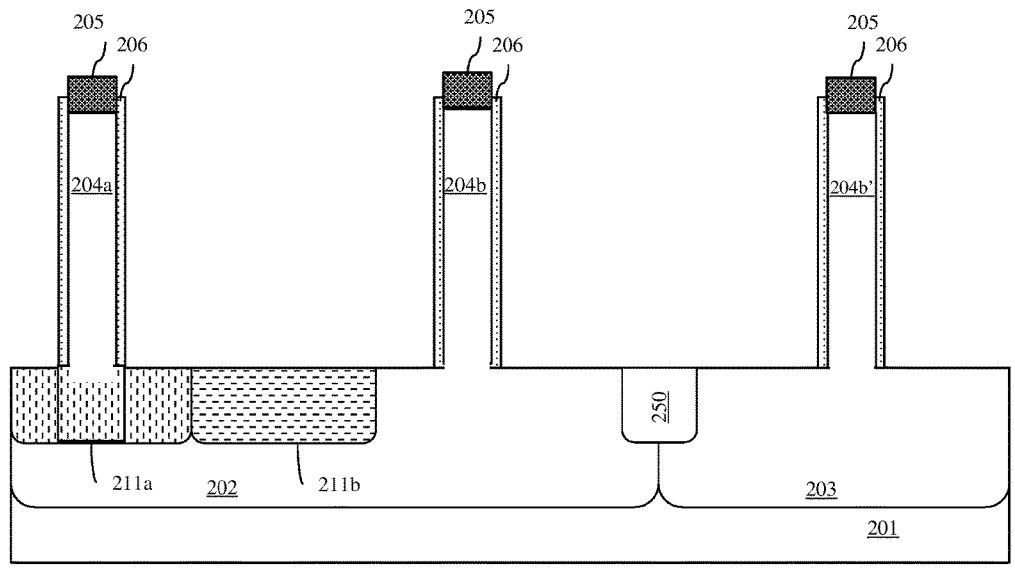

After the sacrificial dielectric sidewall spacers 206 are formed, doped regions can be formed in the semiconductor substrate and these doped regions can include at least the following in the N-well 102: a P-doped region and, particularly, a first anode 211a for the first device 290a adjacent to the lower end of the first semiconductor fin 204a; and an N-doped region 211b for the second device 290b abutting the first anode 111a and offset from the second semiconductor fin 204b (see process 510 and FIG. 17). That is, the N-doped region 211b can be formed such that the second semiconductor fin 204b is positioned on the N-well 202 between and physically separated from both the N-doped region 211b and the STI region 250, which is at the interface between the N-well 202 and the P-well 203.

To form such doped regions at process 510, a series of masked recess etch and in situ-doped epitaxial semiconductor deposition processes can be performed. For example, a first mask can be formed so as to have an opening aligned over and wider than the first semiconductor fin 204a on each N-well 202. An etch process (e.g., a selective anisotropic etch process) can then be performed in order to form a first recess in the N-well 202 adjacent to the lower end of the first semiconductor fin 204a. P-doped epitaxial semiconductor material (e.g., P+ epitaxial silicon) can then be deposited so as to fill this recess, thereby forming in the first anode 211a for the first device 290a. It should be noted that these same processes can be performed concurrently with the formation of lower P-type source/drain regions for P-type VFETs adjacent to the lower ends of semiconductor fins elsewhere on the semiconductor substrate. The first mask can then be removed and a second mask can be formed so as to have an opening between the first semiconductor fin 204a and the second semiconductor fin 204b and, specifically, overlapping the previously formed first anode 211a for the first device 290a. An etch process (e.g., a selective anisotropic etch process) can then be performed in order to etch a second recess into the semiconductor substrate immediately adjacent to the first anode 211a of the first device 290a. N-doped epitaxial semiconductor material (e.g., N+ epitaxial silicon) can then be deposited so as to fill this recess, thereby forming an N-doped region 211b for the second device 290b abutting the first anode 211a of the first device 290a. It should be noted that these same processes can be performed concurrently with the formation of lower N-type source/drain regions for N-type VFETs adjacent to the lower ends of semiconductor fins elsewhere on the semiconductor substrate.

Following formation of the first anode 211a of the first device 290a (i.e., the vertical PIN diode) and the N-doped region 211b of the second device 290b (i.e., the SCR), additional processing can be performed in order to complete the first device 290a and the second device 290b. The additional processing can include the deposition of in situ-doped epitaxial semiconductor material on upper ends of the semiconductor fins including at least the following: deposition of N-doped epitaxial semiconductor material (e.g., N+ epitaxial silicon) on the upper end of the first semiconductor fin 204a to form the first cathode 212a for the first device 290a; deposition of P-doped epitaxial semiconductor material (e.g., P+ epitaxial silicon) on the upper end of the second semiconductor fin to form the second anode 212b for the second device 290b; and deposition of additional N-doped semiconductor material (e.g., N+ epitaxial silicon) on the upper end of the additional semiconductor fin 204b' to form a second cathode 212b' for the second device 290c (i.e., the SCR) (see process 512). Furthermore, this additional processing can be integrated with processes used to complete VFETs.

For example, the sacrificial dielectric sidewall spacers 206 can be removed. Then, a first dielectric spacer layer 213 (also referred to herein as a lower dielectric spacer layer) can be deposited and recessed so as to cover exposed surfaces of the semiconductor substrate 201 (including exposed surfaces of the doped regions, the STI region and the N and P wells) and so as to laterally surround a bottom portion of each semiconductor fin (see FIG. 18). It should be noted that if the sacrificial dielectric sidewall spacers 206 were not previously removed, they can be recessed along with the first dielectric spacer layer 213 so that vertical surfaces of the semiconductor fins are exposed.

Figure 18:
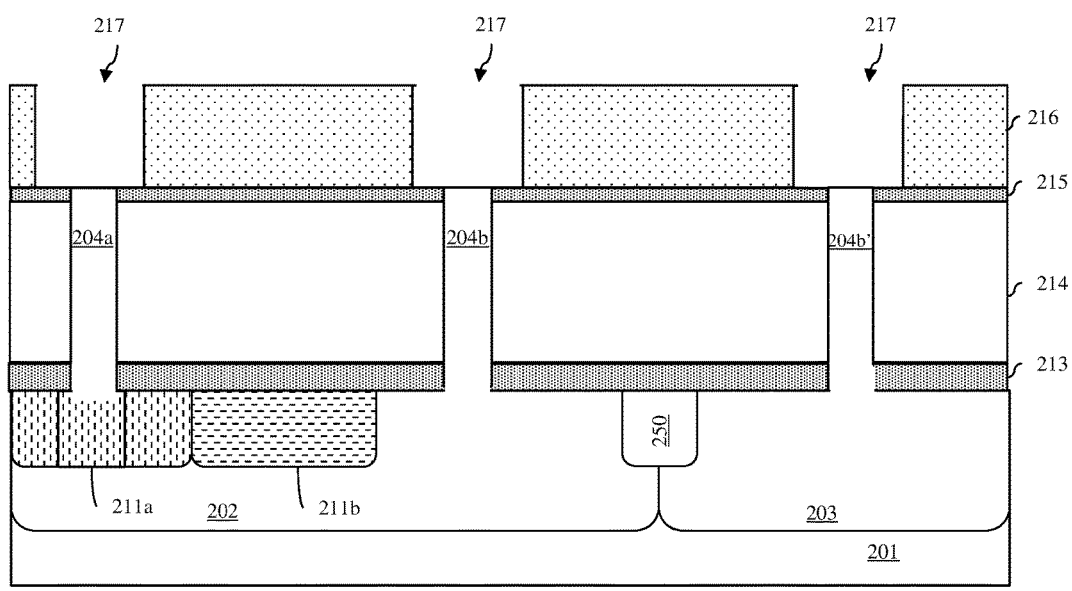

Next, a sacrificial gate layer 214 can be formed above the first dielectric spacer layer 213 so as to laterally surround each semiconductor fin (see FIG. 18). For example, a thin conformal dielectric layer can be deposited followed by deposition of a blanket sacrificial layer (e.g., a polysilicon layer, amorphous silicon layer or any other suitable sacrificial material that can be selectively and isotropically etched away during subsequent processing). These layers can then be recessed so that the resulting sacrificial gate layer 214 is above the first dielectric spacer layer 213 and laterally surrounds each semiconductor fin. A second dielectric spacer layer 215 (also referred to herein as an upper dielectric spacer layer) can be deposited and recessed so that the sacrificial gate layer 214 remains covered and so that upper ends of the semiconductor fins are laterally surrounded by the second dielectric spacer layer 215 (see FIG. 18). It should be noted that the process used to recess the second dielectric spacer layer 215 can also be used to remove the sacrificial dielectric caps 205 from the tops of the semiconductor fins.

An additional blanket sacrificial layer 216 (e.g., a silicon dioxide layer) can be deposited over the partially completed structure and openings 217 can be formed (e.g., lithographically patterned and etched) in the additional blanket sacrificial layer 116 such that each opening is aligned above a corresponding one of the semiconductor fins, is wider than that semiconductor fin and extends vertically down to the second dielectric spacer layer 215 (see FIG. 18). Thus, the tops of the semiconductor fins are exposed within the openings 217. Optionally, the semiconductor fins can be recessed within the openings 217 such that only the top surfaces of the semiconductor fins are exposed.

Figure 19:
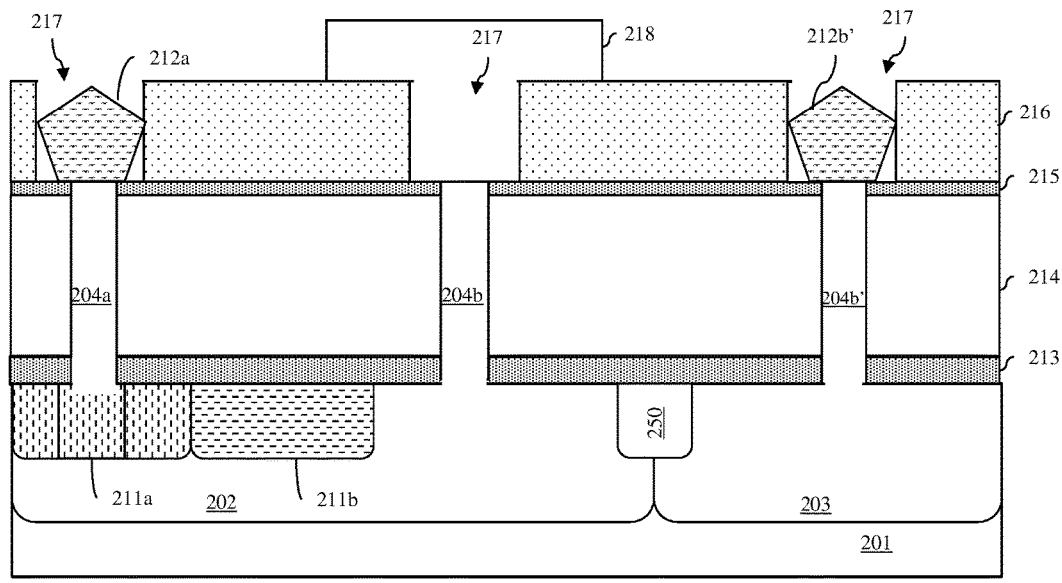

A mask layer 218 can then be deposited and patterned with cathode openings for the first device 290a aligned above the first semiconductor fin 204a on the N-well 202 and for the second device 290b aligned above the additional semiconductor fin 204b' on the P-well 203, as shown in FIG. 19. The same mask layer 218 can also be patterned with N-type source/drain openings for N-type VFETs (not shown). N-doped epitaxial semiconductor material (e.g., N+ epitaxial silicon) can then be deposited in the cathode openings so as to form a first cathode 212a for the first device 290a adjacent to the upper end of the first semiconductor fin 204a and so as to form a second cathode 212b' for the second device 290b adjacent to the upper end of the additional semiconductor fin 204b', as shown in FIG. 19. This same epitaxial deposition process can also be used to form upper N-type source/drain regions for N-type VFETs (not shown). The mask layer 218 can then be selectively removed.

Figure 20:
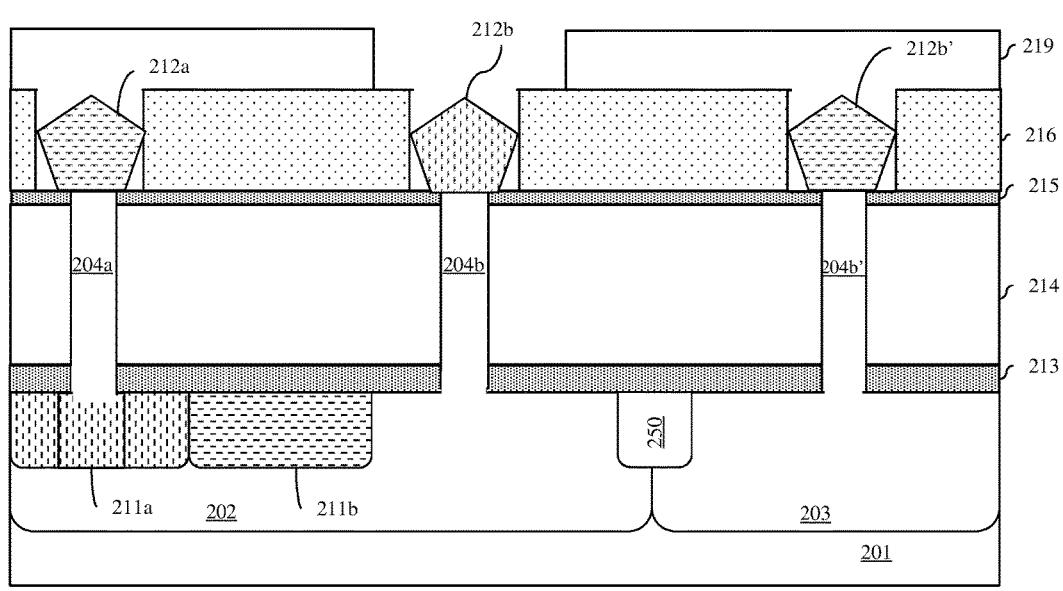

Next, another mask layer 219 can be deposited and patterned with an anode opening for the second device 290b aligned above the second semiconductor fin 204b on the N-well 202, as shown in FIG. 20. The same mask layer 219 can also be patterned with P-type source/drain openings for P-type VFETs (not shown). P-doped epitaxial semiconductor material (e.g., P+ epitaxial silicon) can then be deposited in the anode opening so as to form a second anode 212b for the second device 290b adjacent to the upper end of the second semiconductor fin 204b, as shown in FIG. 20. This same epitaxial deposition process can also be used to form upper P-type source/drain regions for P-type VFETs (not shown). The mask layer 219 can then be selectively removed.

Figure 21:
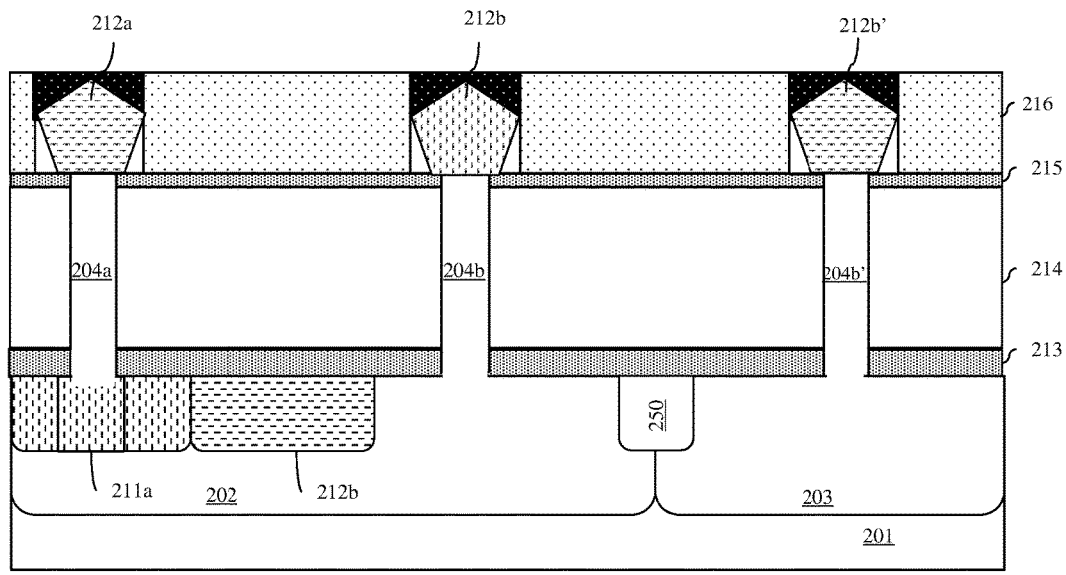
Figure 22:
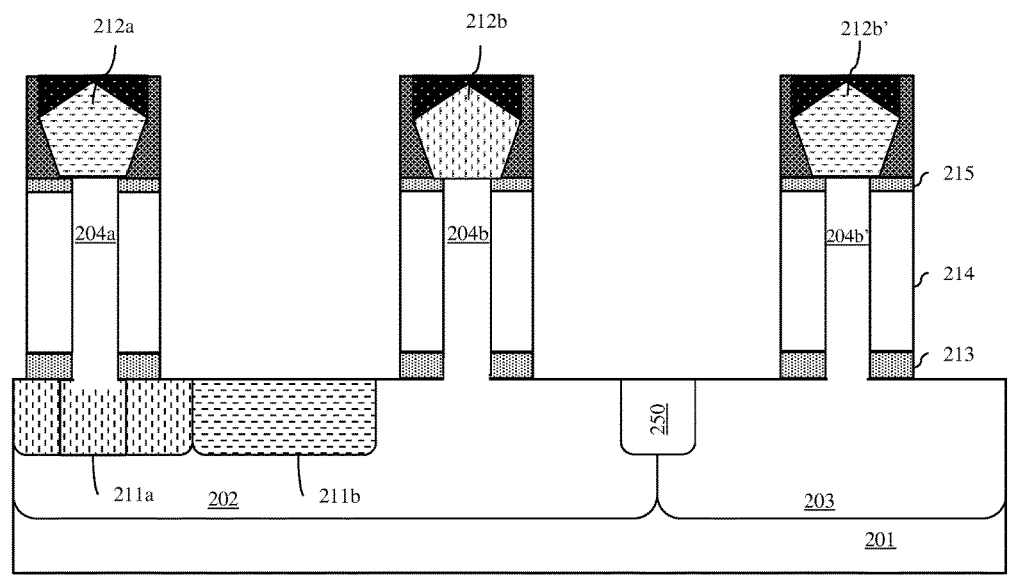

Subsequently, protective dielectric caps 223 can be formed to cover the top surfaces of the first cathode 212a of the first device 190a, and the second anode 212b and second cathode 212b' of the second device 290b (see FIG. 21). This same process can also be used to form protective dielectric caps on any upper source/drain regions of any VFETs (not shown). Next, the additional blanket sacrificial layer 116 can be selectively removed and protective dielectric sidewall spacers 224 can be formed on the second dielectric spacer layer 215 laterally surrounding each first cathode 212a, second anode 212b, second cathode 212b' (see FIG. 22). This same process can also be used to form protective dielectric spacers on any upper source/drain regions of any VFETs (not shown).

It should be noted that the first dielectric spacer layer 213 and the second dielectric spacer layer 215 can be made of the same dielectric material or different dielectric materials (e.g., low-K dielectric material(s)). The protective dielectric sidewall spacers 224 can be made of a different dielectric material than the spacer layers and the protective dielectric caps 223 can be made of a different dielectric material than the protective dielectric sidewall spacers 224.

Figure 23:
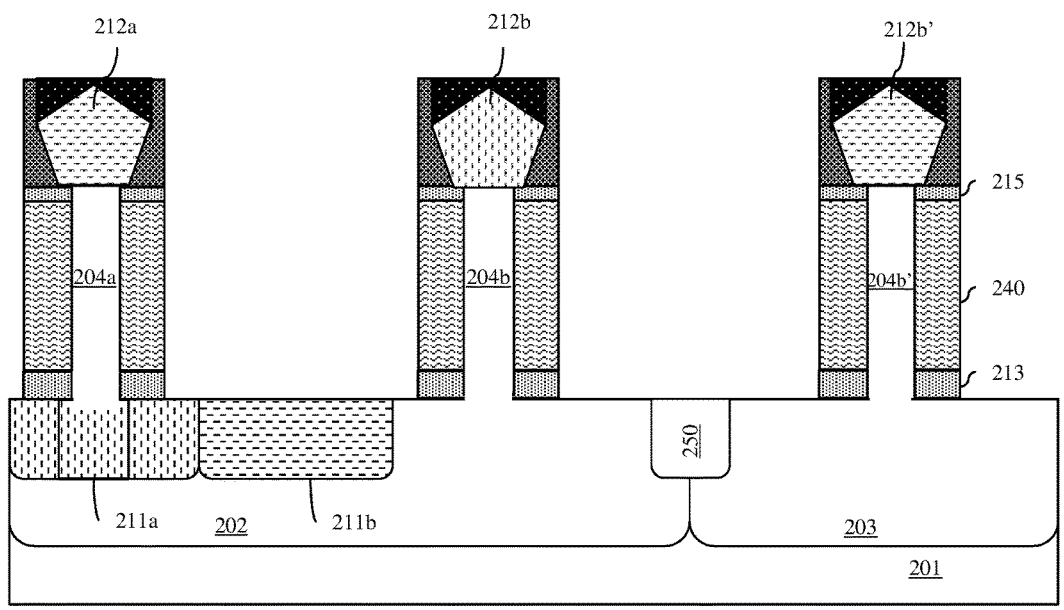

Next, replacement metal gate processing can be performed. It should be understood that, while gates are not required components of diodes, the following processes can be performed to form non-functional gates on the vertical diodes when integration of vertical diode formation and VFET formation is desirable. Specifically, using the protective dielectric caps 223 and protective dielectric sidewall spacers 224 as a mask pattern, an anisotropic etch process can be performed to pattern the second dielectric spacer layer 215 and the sacrificial gate layer 214 (see FIG. 22). The remaining portions of the sacrificial gate layer 214 can then be selectively removed (e.g., using a selective isotropic etch process), thereby creating cavities around the semiconductor fins between the first and second dielectric spacer layers. A replacement gate, such as a replacement metal gate (RMG), can then be formed within each cavity around each semiconductor fin. That is, a conformal gate dielectric layer can be deposited and a gate conductor layer can be deposited on the conformal gate dielectric layer. Another anisotropic etch process can then be performed, again using the combination of the protective dielectric cap 223 and protective dielectric sidewall spacer 224 around each upper anode, upper cathode and upper source/drain region as a mask pattern, in order to pattern the gate conductor and gate dielectric layers (see FIG. 23). While such a gate structure is necessary for VFET function, the gates formed adjacent to the first semiconductor fin 204a of the first device 290a and adjacent to the second semiconductor fin 204b and the additional semiconductor fin 204b' of the second device 290b will not be contacted and, thus, will be non-functional gate structures 240.

It should be understood that the processes described above and illustrated in FIGS. 15-23 are not intended to be limiting. The processes used to complete the first device 290a and the second device 290b for the IC structure embodiments 200A-200B shown in FIGS. 2A-2B can be integrated with any known VFET processing technique as long as the following conditions are met: (1) gate structures formed adjacent to the semiconductor fins of the first device 290a and the second device 290b are not contacted and, thus, non-functional gate structures; (2) upper P-type source/drain regions for P-type VFETs and the second anode 212b of the second device 290b are formed concurrently and (3) upper N-type source/drain regions for N-type VFETs and the first cathode 212a of first device 290a and the second cathode 212b' of the second device 290b are formed currently.

In any case, following gate structure formation, middle of the line (MOL) and back end of the line (BEOL) processing can be performed in order to complete the various different embodiments 200A-200B of the IC structure (see process 514 and FIGS. 2A-2B). This MOL and BEOL processing can include, for example, deposition of interlayer dielectric (ILD) material 245 so as to laterally surround and electrically isolate the gate structures 240.

This MOL and BEOL processing can further include the formation of a local interconnect 260 to electrically connect the first anode 211a of the first device 290a to the N-doped region 211b of the second device 290b, thereby forming a vertical diode/silicon-controlled rectifier (SCR) string and, more particularly, a vertical diode-triggered silicon-controlled rectifier (VDTSCR) (see FIG. 2A). For example, an opening can be formed (e.g., lithographically patterned and etched) such that it extends essentially vertically through the ILD material 245 between the first semiconductor fin 204a and the second semiconductor fin 204b and such that it exposes adjacent portions of the first anode 211a and the N-doped region 211b. A metal silicide layer can be formed at the bottom of the opening and in contact with the exposed adjacent portions of the first anode 211a and the N-doped region 211b. Additional ILD material can then be deposited and polished (e.g., using a CMP process), thereby refilling the opening. Alternatively, this MOL and BEOL processing can include the formation of discrete contacts 261 that land on the first anode 211a and the N-doped region 211b and the formation of metal wiring 262 to electrically connect these contacts 261, thereby forming a vertical diode/silicon-controlled rectifier (SCR) string and, more particularly, a vertical diode-triggered silicon-controlled rectifier (VDTSCR) (see FIG. 2B).

Those skilled in the art will recognize that in the above-described structure and method embodiments different dopants can be used to achieve different type conductivities in the semiconductor materials discussed above and these dopants may vary depending upon the type of semiconductor material. For example, a silicon-based semiconductor material having N-type conductivity is typically doped with a Group V dopant, such as arsenic (As), phosphorous (P) or antimony (Sb), whereas a silicon-based semiconductor material having P-type conductivity is typically doped with a Group III dopant, such as boron (B) or indium (In). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
   a semiconductor substrate; and
   a pair of devices on the semiconductor substrate, the pair of devices comprising:
      a first device comprising:
         a first anode comprising a P-doped region in the semiconductor substrate;
         a first semiconductor fin having a lower end immediately adjacent to the first anode and an upper end opposite the lower end; and,
         a first cathode immediately adjacent to the upper end of the first semiconductor fin; and
      a second device comprising an N-doped region in the semiconductor substrate and positioned laterally immediately adjacent to the P-doped region; and
   at least one interconnect electrically connecting top surfaces of the P-doped region and the N-doped region, wherein the at least one interconnect comprises any one of the following:
      a local interconnect comprising a silicide layer immediately adjacent to the top surfaces of the P-doped region and the N-doped region; and
      contacts on the tops surfaces of the P-doped region and the N-doped region, respectively, and electrically connected by metal wiring.

2. The integrated circuit structure of claim 1,
   wherein the integrated circuit structure further comprises an N-well in the semiconductor substrate,
   wherein the P-doped region comprises a P-type epitaxial semiconductor material in a first recess in the N-well, and
   wherein the N-doped region comprises an N-type epitaxial semiconductor material in a second recess in the N-well and positioned laterally immediately adjacent to the P-type epitaxial semiconductor material, the N-type epitaxial semiconductor material having a higher N-type conductivity level than the N-well.

3. The integrated circuit structure of claim 2, wherein the first device comprises a first diode, and wherein the second device comprises a second diode comprising:
   a second cathode comprising the N-doped region;
   a second semiconductor fin having a lower end immediately adjacent to the second cathode and an upper end opposite the lower end; and
   a second anode immediately adjacent to the upper end of the second semiconductor fin.

4. The integrated circuit structure of claim 3, further comprising non-functional gate structures adjacent the first semiconductor fin and the second semiconductor fin.

5. The integrated circuit structure of claim 3, further comprising:
   an additional N-well in the semiconductor substrate;
   an isolation region in the semiconductor substrate and positioned laterally between the N-well and the additional N-well; and
   an additional device on the semiconductor substrate and comprising:
      an additional anode in the additional N-well;
      an additional semiconductor fin having a lower end immediately adjacent to the additional anode and an upper end opposite the lower end; and
      an additional cathode immediately adjacent to the upper end of the additional semiconductor fin,
   wherein the second anode and the additional cathode are electrically connected.

6. The integrated circuit structure of claim 3, further comprising:
   an additional N-well in the semiconductor substrate;
   an isolation region in the semiconductor substrate and positioned laterally between the N-well and the additional N-well; and
   an additional pair of devices comprising:
      an additional first device comprising:
         an additional first anode in the additional N-well;
         an additional first semiconductor fin having a lower end immediately adjacent to the additional first anode and an upper end opposite the lower end; and
         an additional first cathode immediately adjacent to the upper end of the additional first semiconductor fin; and
      an additional second device comprising:
         an additional second cathode in the additional N-well and positioned laterally immediately adjacent to the additional first anode;
         an additional second semiconductor fin having a lower end immediately adjacent to the additional second cathode and an upper end opposite the lower end; and
         an additional second anode immediately adjacent to the upper end of the additional second semiconductor fin,
      wherein the additional first anode and the additional second cathode are electrically connected.

7. The integrated circuit structure of claim 3, further comprising:
   an additional device on the semiconductor substrate and comprising:
      an additional anode in the N-well;
      an additional semiconductor fin having a lower end immediately adjacent to the additional anode and an upper end opposite the lower end; and
      an additional cathode immediately adjacent to the upper end of the additional semiconductor fin,
   wherein the first cathode and the additional anode are electrically connected.

8. An integrated circuit structure comprising:
   a semiconductor substrate;
   an N-well in the semiconductor substrate;
   a P-well in the semiconductor substrate positioned laterally immediately adjacent to the N-well;
   a pair of devices comprising:
      a first device comprising a diode, the diode comprising:
         a first anode comprising a P-doped region in the N-well;
         a first semiconductor fin having a lower end immediately adjacent to the first anode and an upper end opposite the lower end; and,
         a first cathode immediately adjacent to the upper end of the first semiconductor fin; and
      a second device comprising a silicon-controlled rectifier, the silicon-controlled rectifier comprising:
         an N-doped region in the N-well and positioned laterally immediately adjacent to the first anode;
         a second semiconductor fin having a lower end immediately adjacent to the N-well and an upper end opposite the lower end, wherein the second semiconductor fin is positioned on the N-well between the N-doped region and an interface between the N-well and the P-well;
         a second anode immediately adjacent to the upper end of the second semiconductor fin;
         an additional semiconductor fin having a lower end immediately adjacent to the P-well and an upper end opposite the lower end; and
         a second cathode immediately adjacent to the upper end of the additional semiconductor fin.

9. The integrated circuit structure of claim 8, wherein the first anode comprises a P-type epitaxial semiconductor material in a first recess in the N-well, wherein the N-doped region comprises an N-type epitaxial semiconductor material in a second recess in the N-well and positioned laterally immediately adjacent to the P-type epitaxial semiconductor material, and wherein the N-type epitaxial semiconductor material has a higher N-type conductivity level than the N-well.

10. The integrated circuit structure of claim 8, further comprising a local interconnect immediately adjacent to top surfaces of the P-doped region and the N-doped region, wherein the local interconnect electrically connects the P-doped region to the N-doped region.

11. The integrated circuit structure of claim 8, further comprising contacts on top surfaces of the P-doped region and the N-doped region, respectively, wherein the contacts are electrically connected by metal wiring such that the P-doped region is electrically connected to the N-doped region.

12. The integrated circuit structure of claim 8, further comprising an isolation region in the semiconductor substrate at the interface between the N-well and the P-well, wherein the N-well and the P-well extend deeper into the semiconductor substrate than the isolation region.

13. An integrated circuit structure comprising:
   a semiconductor substrate;
   a pair of devices on the semiconductor substrate, the pair of devices comprising:

a first device comprising:
  a first anode comprising a P-doped region in the semiconductor substrate;
  a first semiconductor fin having a lower end immediately adjacent to the first anode and an upper end opposite the lower end;
  an intrinsic region in the first semiconductor fin; and,
  a first cathode immediately adjacent to the upper end of the first semiconductor fin; and
a second device comprising an N-doped region in the semiconductor substrate and positioned laterally immediately adjacent to the P-doped region,
wherein the P-doped region and the N-doped region are electrically connected,
wherein the integrated circuit structure further comprises an N-well in the semiconductor substrate,
wherein the P-doped region comprises a P-type epitaxial semiconductor material in a first recess in the N-well, and
wherein the N-doped region comprises an N-type epitaxial semiconductor material in a second recess in the N-well and positioned laterally immediately adjacent to the P-type epitaxial semiconductor material, the N-type epitaxial semiconductor material having a higher N-type conductivity level than the N-well.

14. The integrated circuit structure of claim 13, further comprising at least one interconnect electrically connecting top surfaces of the P-doped region and the N-doped region.

15. The integrated circuit structure of claim 13,
wherein the first device comprises a first diode, and
wherein the second device comprises a second diode comprising:
  a second cathode comprising the N-doped region;
  a second semiconductor fin having a lower end immediately adjacent to the second cathode and an upper end opposite the lower end; and
  a second anode immediately adjacent to the upper end of the second semiconductor fin.

16. The integrated circuit structure of claim 15, further comprising non-functional gate structures adjacent the first semiconductor fin and the second semiconductor fin.

* * * * *